US011061268B2

(12) United States Patent
Park et al.

(10) Patent No.: US 11,061,268 B2
(45) Date of Patent: Jul. 13, 2021

(54) DISPLAY DEVICE AND METHOD OF MANUFACTURING THE SAME

(71) Applicant: Samsung Display Co., Ltd., Yongin-si (KR)

(72) Inventors: Sang Ji Park, Seoul (KR); Kang Uk Kim, Hwaseong-si (KR); Hae Ju Yun, Hwaseong-si (KR); Don Chan Cho, Seongnam-si (KR); Young Je Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 207 days.

(21) Appl. No.: 15/825,005

(22) Filed: Nov. 28, 2017

(65) Prior Publication Data

US 2019/0025634 A1 Jan. 24, 2019

(30) Foreign Application Priority Data

Jul. 21, 2017 (KR) .................. 10-2017-0093006

(51) Int. Cl.
*G02F 1/1335* (2006.01)
*G02F 1/13357* (2006.01)
*G02F 1/1333* (2006.01)
*G02F 1/1368* (2006.01)

(52) U.S. Cl.
CPC .. *G02F 1/133512* (2013.01); *G02F 1/133377* (2013.01); *G02F 1/133514* (2013.01); *G02F 1/133516* (2013.01); *G02F 1/133617* (2013.01); *G02F 1/1368* (2013.01); *G02F 1/133519* (2021.01); *G02F 1/133528* (2013.01)

(58) Field of Classification Search
CPC ................................. G02F 1/133512
See application file for complete search history.

(56) References Cited

U.S. PATENT DOCUMENTS

| 7,826,011 | B2 | 11/2010 | Yang et al. | |
|---|---|---|---|---|
| 8,273,423 | B2 | 9/2012 | Yoshioka et al. | |
| 9,599,856 | B2 | 3/2017 | Lee et al. | |
| 2012/0268700 | A1* | 10/2012 | Shu | G03F 7/0007 349/106 |
| 2015/0205159 | A1* | 7/2015 | Itou | G02F 1/133617 349/110 |
| 2016/0033823 | A1* | 2/2016 | Lee | G02F 1/133617 349/71 |
| 2017/0003423 | A1* | 1/2017 | Jiang | G02B 5/201 |
| 2017/0168223 | A1* | 6/2017 | Feng | G02B 26/001 |
| 2017/0255054 | A1* | 9/2017 | Li | G02F 1/133512 |
| 2018/0210283 | A1* | 7/2018 | Song | G02B 5/201 |

FOREIGN PATENT DOCUMENTS

| JP | 4854512 | 1/2012 |
|---|---|---|
| KR | 10-2016-0015480 | 2/2016 |

* cited by examiner

*Primary Examiner* — Alexander P Gross
(74) *Attorney, Agent, or Firm* — H.C. Park & Associates, PLC

(57) ABSTRACT

A display device and a method of manufacturing a display device, the display device having a plurality of pixels defined therein and including: a first substrate; a partition wall disposed on the first substrate to define openings corresponding to the plurality of pixels; and color conversion patterns disposed in the openings. The partition wall includes a light-transmitting structure having a groove and a first partition wall portion disposed in the groove and having a higher optical density than the light-transmitting structure.

14 Claims, 35 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2017-0093006, filed on Jul. 21, 2017, which is hereby incorporated by reference for all purposes as if fully set forth herein.

BACKGROUND

Field

Exemplary embodiments relate to a display device and a method of manufacturing a display device.

Discussion of the Background

Display devices have become increasingly important in accordance with developments in multimedia technology. Accordingly, various types of display devices, such as a liquid crystal display (LCD) device, an organic light-emitting display device, etc., have been used.

The LCD device includes a display panel having two substrates on which electric field generating electrodes such as pixel electrodes and a common electrode are formed, a liquid crystal layer interposed between the two substrates, and a light source unit providing light to the display panel. The LCD device displays an image by applying voltages to the electric field generating electrodes to realign liquid crystal molecules in the liquid crystal layer and thus, to control the amount of light passing through the liquid crystal layer for each pixel.

In order for each pixel to uniquely display one basic color, a color conversion pattern may be arranged for each pixel on the path of light from a light source to a viewer. For example, a color filter may realize a basic color by absorbing a particular wavelength band of incident light and selectively transmitting therethrough another particular wavelength band of the incident light. In the meantime, a method is needed to further improve the color purity of a display device.

A wavelength shift material, such as a quantum dot material or a fluorescent material, shifts the peak wavelength of incident light and thereby emits light having a different color from the incident light. That is, by using the wavelength shift material, a color conversion pattern can be realized. However, if light emitted from the wavelength shift material of one pixel travels into other neighboring pixels, light may unintentionally leak, that is, light leakage failure may occur.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a display device capable of improving display quality by blocking the travel of light between adjacent pixels.

Exemplary embodiments also provide a method of manufacturing a display device with an improved display quality.

Additional aspects will be set forth in the detailed description which follows, and, in part, will be apparent from the disclosure, or may be learned by practice of the inventive concepts.

An exemplary embodiment discloses a display device having a plurality of pixels defined therein, the display device including: a first substrate; a partition wall disposed on the first substrate and defining openings corresponding to the plurality of pixels; and color conversion patterns disposed in the openings. The partition wall includes a light-transmitting structure having a groove and a first partition wall portion disposed in the groove and having a higher optical density than the light-transmitting structure.

The partition wall may have a plurality of first portions extending in a first direction and a plurality of second portions extending in a second direction intersecting the first direction. The openings may be defined by the first portions and the second portions, and the color conversion patterns may include a quantum dot material or a fluorescent material.

The first partition wall portion may extend in a first direction and a second direction intersecting the first direction, and may define the openings corresponding to the plurality of pixels.

A minimum spacing distance in the first direction between adjacent portions of the partition wall may be greater than a maximum width in the first direction of the groove.

The display device may further include a light-shielding member disposed between the first substrate and the partition wall. The first partition wall portion may be in contact with the light-transmitting structure and the light-shielding member, and a maximum width of the partition wall may be less than a maximum width of the light-shielding member.

The display device may further include a light-shielding member disposed between the first substrate and the partition wall. The first partition wall portion may include substantially the same material as the light-shielding member.

The light-transmitting structure may have a light transmittance equal to or greater than about 90%, and the first partition wall portion may have an optical density equal to or greater than about 2.0/2 µm.

The first partition wall portion may have a height equal to or greater than about 7.0 µm, and the first partition wall portion may have a width equal to or greater than about 1.0 µm.

The partition wall further may include second partition wall portions disposed between the light-transmitting structure and the color conversion patterns and having a higher optical density than the light-transmitting structure.

The second partition wall portions may be in contact with the color conversion patterns, and a slope of sides of the second partition wall portions in contact with the color conversion patterns may be different from a slope of sides of the second partition wall portions in contact with the light-transmitting structure.

The plurality of pixels may include a first pixel displaying a first color and a second pixel displaying a second color having a shorter peak wavelength than the first color. The display device may further include: a first wavelength band filter disposed between the color conversion patterns and the first substrate and disposed in the first pixel; a liquid crystal layer disposed on the color conversion patterns; a second wavelength band filter disposed between the color conversion patterns and the liquid crystal layer; a polarizing layer disposed between the second wavelength disposed between the second wavelength conversion filter and the liquid crystal layer; a second substrate disposed on the liquid crystal layer; and a light source unit disposed on the second substrate and providing light of the second color. The color conversion pattern may include a first color conversion pattern disposed in the first pixel, converting light incident thereupon into light of the first color, and emitting the converted light. The first wavelength band filter may transmit therethrough light of a wavelength band including a peak wavelength of the first color and may block the transmission of light of a wavelength band including a peak wavelength of the second color. The second wavelength band filter may transmit therethrough light of a wavelength band including the peak wavelength of the second color and may reflect light of a wavelength band including the peak wavelength of the first color. The second wavelength band filter may be in contact with the first color conversion pattern, the light-transmitting structure, and the first partition wall portion.

The plurality of pixels may further include a third pixel displaying a third color, which has a longer peak wavelength than the second color and has a different peak wavelength from the first color. The display device may further include a light-transmitting pattern disposed in the second pixel. The color conversion patterns may further include a second color conversion pattern disposed in the third pixel. The second color conversion pattern converts light incident thereupon into light of the third color and emits the converted light. A third partition wall portion may disposed between the first and second color conversion patterns, and the third partition wall portion may be also disposed between the first color conversion pattern and the light-transmitting pattern.

The plurality of pixels may further include a fourth pixel displaying the first color. The color conversion patterns may further include a third color conversion pattern disposed in the fourth pixel. The third color conversion pattern converts light incident thereupon into light of the first color and emits the converted light, and the first partition wall portion may be disposed between the first and third color conversion patterns.

The plurality of pixels may further include a third pixel displaying a third color, which has a longer peak wavelength than the second color and has a different peak wavelength from the first color. The display device may further include a light-shielding member disposed between the first substrate and the partition wall. The first wavelength band filter may be formed in one integral body over the first and third pixels, and the first wavelength band filter may be in contact with the light-transmitting structure, the first partition wall portion, and the light-shielding member.

An exemplary embodiment also discloses a method of manufacturing a display device, including: forming a light-transmitting structure having a groove on a substrate to define a plurality of openings; and forming a partition wall portion having a higher optical density than the light-transmitting structure in the groove.

The forming the partition wall portion, may include: filling the groove with a light-shielding composition; and forming the partition wall portion by curing the light-shielding composition.

The curing the light-shielding composition may include: prebaking the light-shielding composition, partially curing the prebaked light-shielding composition by applying light; and hard-baking the partially cured light-shielding composition, and the partition wall portion may have a height of about 7.0 μm or higher.

The filling the groove with the light-shielding composition may include applying the light-shielding composition on an entire surface of the substrate, and the method may further include, after the curing the light-shielding composition, removing the light-shielding composition that remains uncured.

The forming the light-transmitting structure may include: forming a negative photosensitive layer on the substrate; and patterning the light-transmitting structure using a mask as a light-shielding mask. The partially curing the prebaked light-shielding composition may include: shifting the mask so as for openings of the mask to partially overlap with the groove; and partially curing the prebaked light-shielding composition by applying light.

The method may further include, after the removing the light-shielding composition that remains uncured: ejecting an ink composition including a wavelength shift material into the openings defined by the light-transmitting structure; and curing the ink composition, wherein the light-transmitting structure may have a height equal to or greater than about 7.0 μm.

According to the aforementioned and other exemplary embodiments of the inventive concepts, since a light-shielding member capable of blocking the travel of light between adjacent pixels is provided, light can be prevented from leaking from unintended pixels, and as a result, the display quality of a display device can be improved.

In addition, a display device with an improved display quality can be manufactured.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
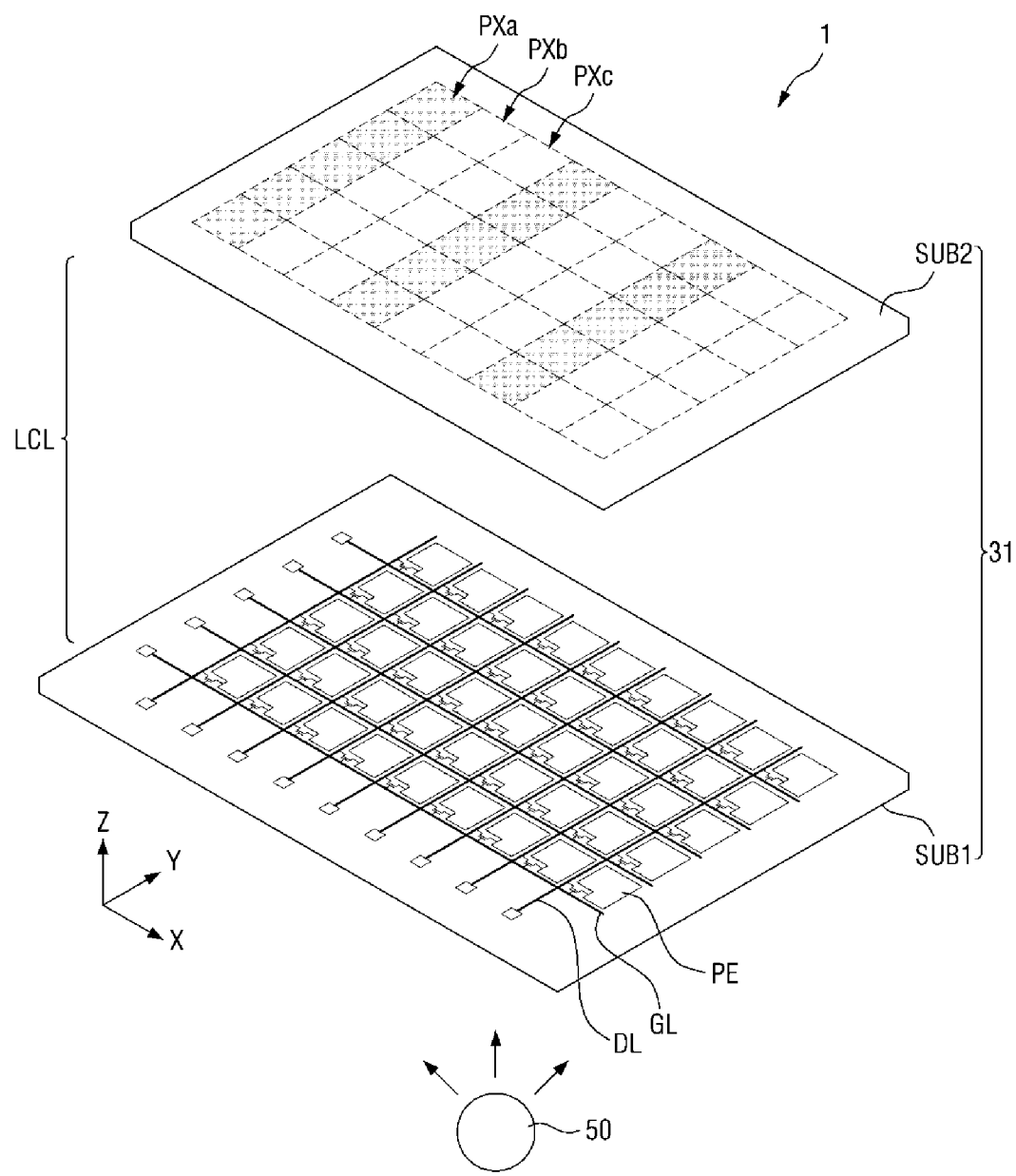
FIG. 1 is an exploded perspective view of a display device according to an exemplary embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the inventive concepts.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Exemplary embodiments of the inventive concepts will hereinafter be described with reference to the accompanying drawings.

Figure 2:
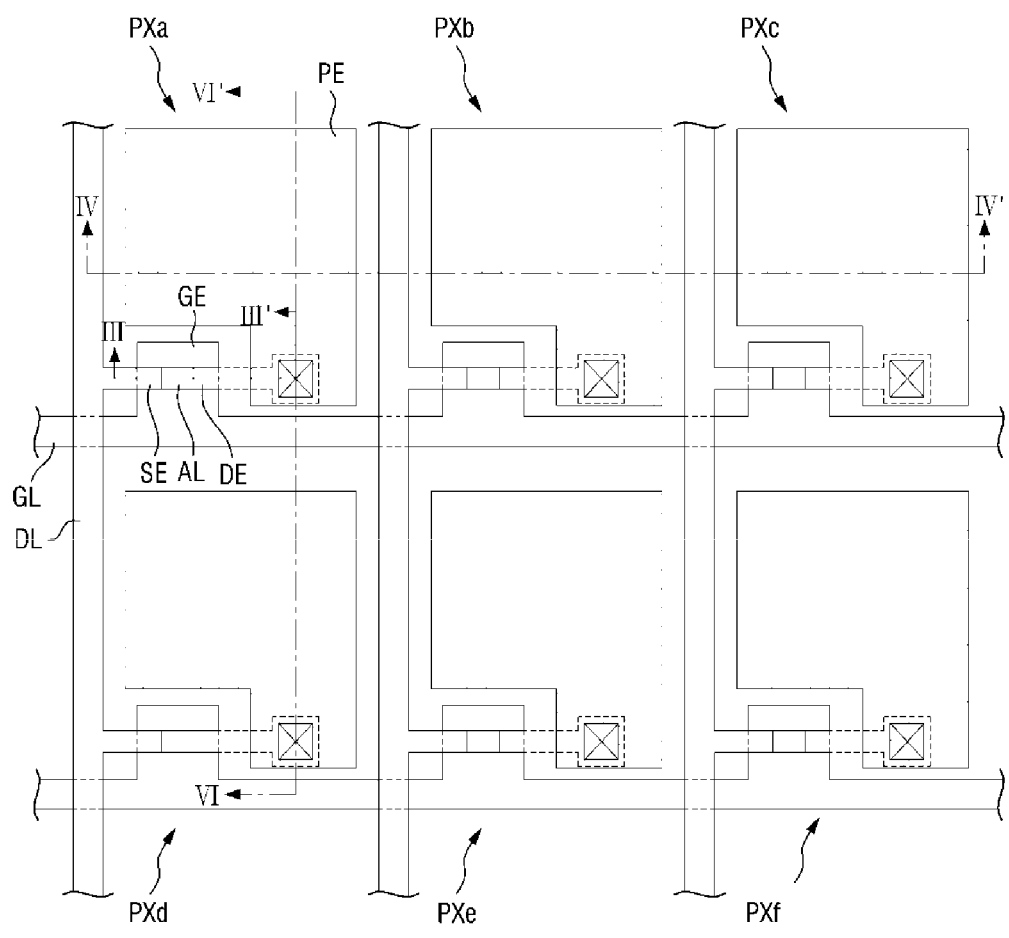
FIG. 2 is a layout view illustrating arbitrary pixels of the display device according to the exemplary embodiment of FIG. 1.

FIG. 1 is an exploded perspective view of a display device according to an exemplary embodiment of the inventive concepts. FIG. 2 is a layout view illustrating arbitrary pixels of the display device according to the exemplary embodiment of FIG. 1.

Referring to FIGS. 1 and 2, a display device 1 includes a display panel 31 and a light source unit 50, which provides light to the display panel 31.

The display panel 31 may include a first display substrate SUB1, a second display substrate SUB2, which faces the first display substrate SUB1, and a liquid crystal layer LCL, which is interposed between the first and second display panels SUB1 and SUB2. The liquid crystal layer LCL may be sealed by the first and second display substrates SUB1 and SUB2 and a sealing member (not illustrated), which bonds the first and second display substrates SUB1 and SUB2 together.

A plurality of pixels may be defined on the display panel 31 to be arranged substantially in a matrix form on a plane. As used herein, the term "pixel" denotes a single region defined, from a planar viewpoint, by dividing a display area for the display of various colors, and one pixel can represent a predetermined basic color. That is, one pixel may be a minimum unit of the display panel 31 for displaying a color and may be capable of displaying a color independently of other pixels.

The plurality of pixels include a first pixel PXa displaying a first color, a second pixel PXb displaying a second color having a shorter peak wavelength than the first color, and a third pixel PXc displaying a third color having a shorter peak wavelength than the second color. In an exemplary embodiment, the first, second, and third pixels PXa, PXb, and PXc, which are sequentially arranged in the first direction X, may form a basic unit together, the basic unit may be repeatedly arranged in the first direction X, and the first, second, and third pixels PXa, PXb, and PXc may each be repeatedly arranged in the second direction Y.

For example, the first pixel PXa may be a pixel displaying a first color (i.e., a red color) having a peak wavelength of about 610 nm to 650 nm, the second pixel PXb, which is adjacent to the first pixel PXa in the first direction, may be a pixel displaying a second color (i.e., a green color) having a peak wavelength of about 530 nm to 570 nm, and the third pixel PXc, which is adjacent to the second pixel PXb in the first direction X, may be a pixel displaying a third color (i.e., a blue color) having a peak wavelength of about 430 nm to 470 nm.

A fourth pixel PXd, which is adjacent to the first pixel PXa in the second direction Y, may be a pixel displaying the first color, a fifth pixel PXe, which is adjacent to the second pixel PXb in the second direction Y, may be a pixel displaying the second color, and a sixth pixel PXf, which is adjacent to the third pixel PXc in the second direction Y, may be a pixel displaying the third color.

The display panel 31 may include a plurality of gate lines GL, which extend in the first direction, and a plurality of data lines DL, which extend in the second direction Y and are insulated from the gate lines GL. The gate lines GL and the data lines DL may be connected to driving units (not illustrated) and may thereby provide driving signals to pixel electrodes PE included in the plurality of pixels.

The light source unit 50 may be disposed below the display panel 31 and may emit light having a particular wavelength to the display panel 31. The light source unit 50 may include a light source, which directly emits light, and a light guide plate (not illustrated), which guides the light emitted by the light source to travel toward the display panel 31. The material of the light guide plate is not particularly limited. For example, the light guide plate may be formed of a glass material, a quartz material, or a plastic material such as polyethylene terephthalate (PET) or polycarbonate (PC).

The light source may be a light-emitting diode (LED) or an organic LED (OLED). In an exemplary embodiment, the light source may emit light having a shorter peak wavelength than the first color or the second color.

Although not specifically illustrated, one or more optical sheets may be disposed between the display panel 31 and the light source unit 50. The optical sheets may include at least one of a prism sheet, a diffusion sheet, a (reflective) polarizing sheet, a lenticular lens sheet, and a micro-lens sheet. The optical sheets can improve the display quality of the display device 1 by modulating the optical characteristics (such as condensation, diffusion, scattering, or polarization characteristics) of light that is provided by the light source unit 50 and travels toward the display panel 31.

The display substrate SUB1 of the display panel 31 will hereinafter be described with reference to FIG. 3.

Figure 3:
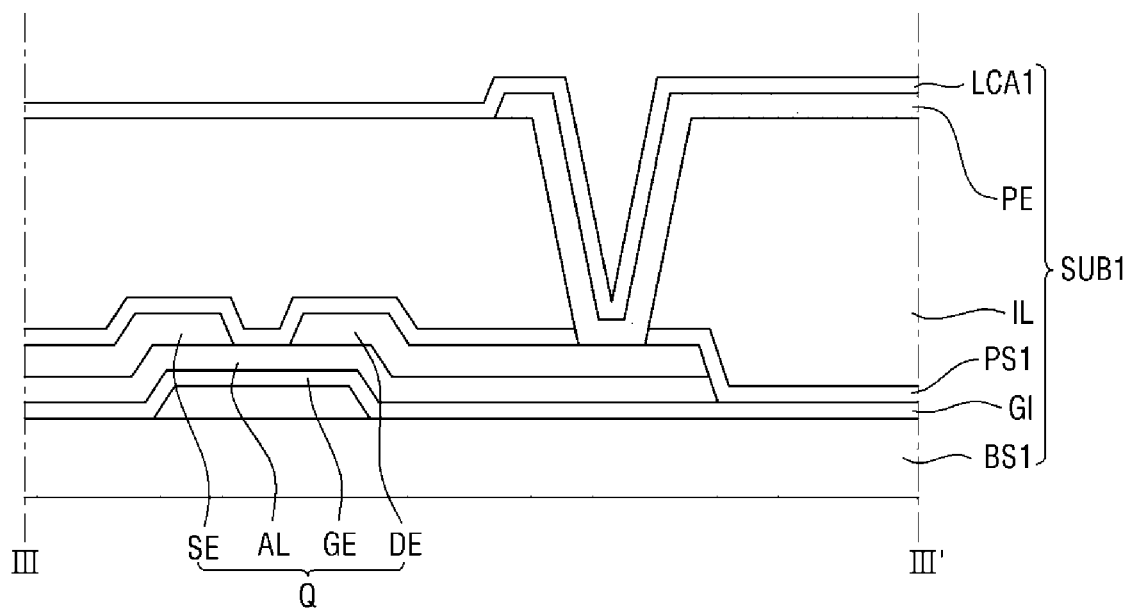
FIG. 3 is a cross-sectional view, taken along line of FIG. 2, of a first display substrate.

FIG. 3 is a cross-sectional view, taken along line of FIG. 2, of the first display substrate of the display device according to the exemplary embodiment of FIG. 1.

Referring to FIGS. 1 through 3, the first display substrate SUB1 may include a first substrate BS1, a switching element Q, which is disposed on one surface (i.e., the top surface in FIG. 3) of the first substrate BS1, and a pixel electrode PE, which is disposed on the switching element Q.

The first substrate BS1 may be a transparent insulating substrate. For example, the first substrate BS1 may be a substrate formed of a glass material, a quartz material, or a light-transmitting plastic material. In some exemplary embodiments, the first substrate BS1 may have flexibility, and the display device 1 may be a curved display device.

More than one switching element Q may be disposed on the first substrate BS1. The switching element Q may be disposed in each of the plurality of pixels (including the first, second, and third pixels PXa, PXb, and PXc) and may transmit driving signals to the pixel electrode PE, which will be described later, or may block the transmission of the driving signals to the pixel electrode PE. In an exemplary embodiment, the switching element Q includes a gate electrode GE, an active layer AL, which is disposed on the gate electrode GE, and source and drain electrodes SE and DE, which are spaced apart from each other on the active layer AL.

The gate electrode GE, which is a control terminal, may be connected to a gate line GL to receive a gate driving signal, the source electrode SE, which is an input terminal, may be connected to a data line DL to receive a data driving signal, the drain electrode DE, which is an output terminal, may be electrically connected to the pixel electrode PE. The active layer AL may include amorphous silicon or polycrystalline silicon, or may be formed of an oxide semiconductor. The active layer AL serves as a channel of the switching element Q and may turn on or off the channel depending on a voltage applied to the gate electrode GE. The gate electrode GE and the active layer AL may be insulated by an insulating film GI. Although not specifically illustrated, in a case where the active layer AL is formed of amorphous silicon or the like, an ohmic contact layer (not illustrated) may be further disposed between the active layer AL and the source and drain electrodes SE and DE.

A first passivation layer PS1 may be disposed on the source and drain electrodes SE and DE to protect wiring and electrodes formed therebelow. The first passivation layer PS1 may include an inorganic material. Examples of the inorganic material include silicon nitride ($SiN_x$), silicon oxide ($SiO_x$), silicon nitride oxide ($SiN_xO_y$, where x>y), and silicon oxynitride ($SiO_xN_y$, where x>y).

An intermediate layer IL may be disposed on the switching element Q. The intermediate layer IL may insulate elements formed thereon from elements formed therebelow and may planarize any height differences formed by elements stacked on the first substrate BS1. The intermediate layer IL may include one or more layers. For example, the intermediate layer IL may be formed of an organic material or an inorganic material, or may have a stack of a layer formed of an organic material and a layer formed of an inorganic material.

The pixel electrode PE may be disposed on the intermediate layer IL. The pixel electrode PE may form an electric field in the liquid crystal layer LCL together with a common electrode CE, which will be described later, and may thus control the alignment direction of liquid crystal molecules LC in each of the plurality of pixels. The pixel electrode PE may be electrically connected to the drain electrode DE of the switching element Q through a contact hole formed in the intermediate layer IL. The pixel electrode PE may be arranged in each of the plurality of pixels (including the first, second, and third pixels PXa, PXb, and PXc) and may receive a voltage via the switching element Q independently of other pixel electrodes PE. The pixel electrode PE may be a transparent electrode formed of a transparent conductive material. Examples of a material for forming the transparent electrode include indium tin oxide (ITO) or indium zinc oxide (IZO). FIG. 2 illustrates an example in which no slits are formed on the pixel electrode PE, but in another example, the pixel electrode PE may have radial slits formed thereon.

A first liquid crystal alignment layer LCA1 may be disposed on the pixel electrode PE. The first liquid crystal alignment layer LCA1 may induce the initial alignment of the liquid crystal molecules LC in the liquid crystal layer LCL. As used herein, the term "initial alignment of liquid crystal molecules" means the arrangement of liquid crystal molecules in the absence of an electric field in a liquid crystal layer. The first liquid crystal alignment layer LCA1 may include a polymer organic material having an imide group in the repeating unit of its main chain.

The liquid crystal layer LCL and the second display substrate SUB2 of the display panel 31 will hereinafter be described with reference to FIGS. 4 through 7B.

Figure 4:
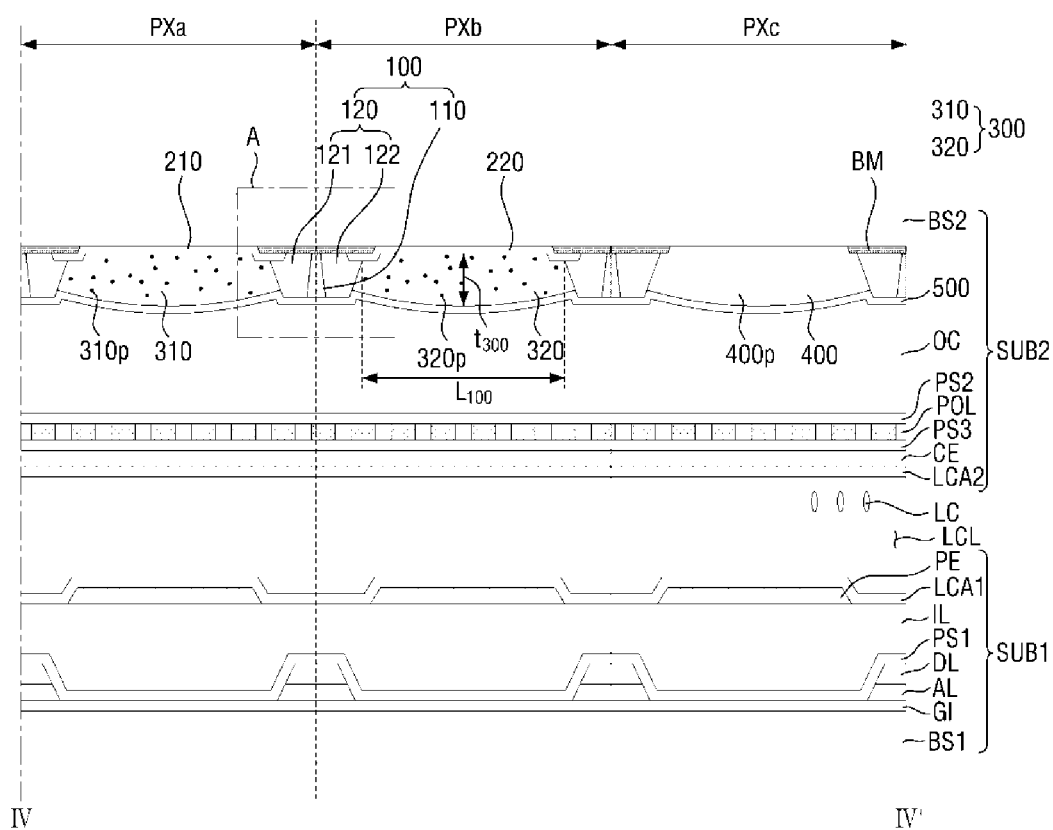
FIG. 4 is a cross-sectional view taken along line IV-IV' of FIG. 2.
Figure 5:
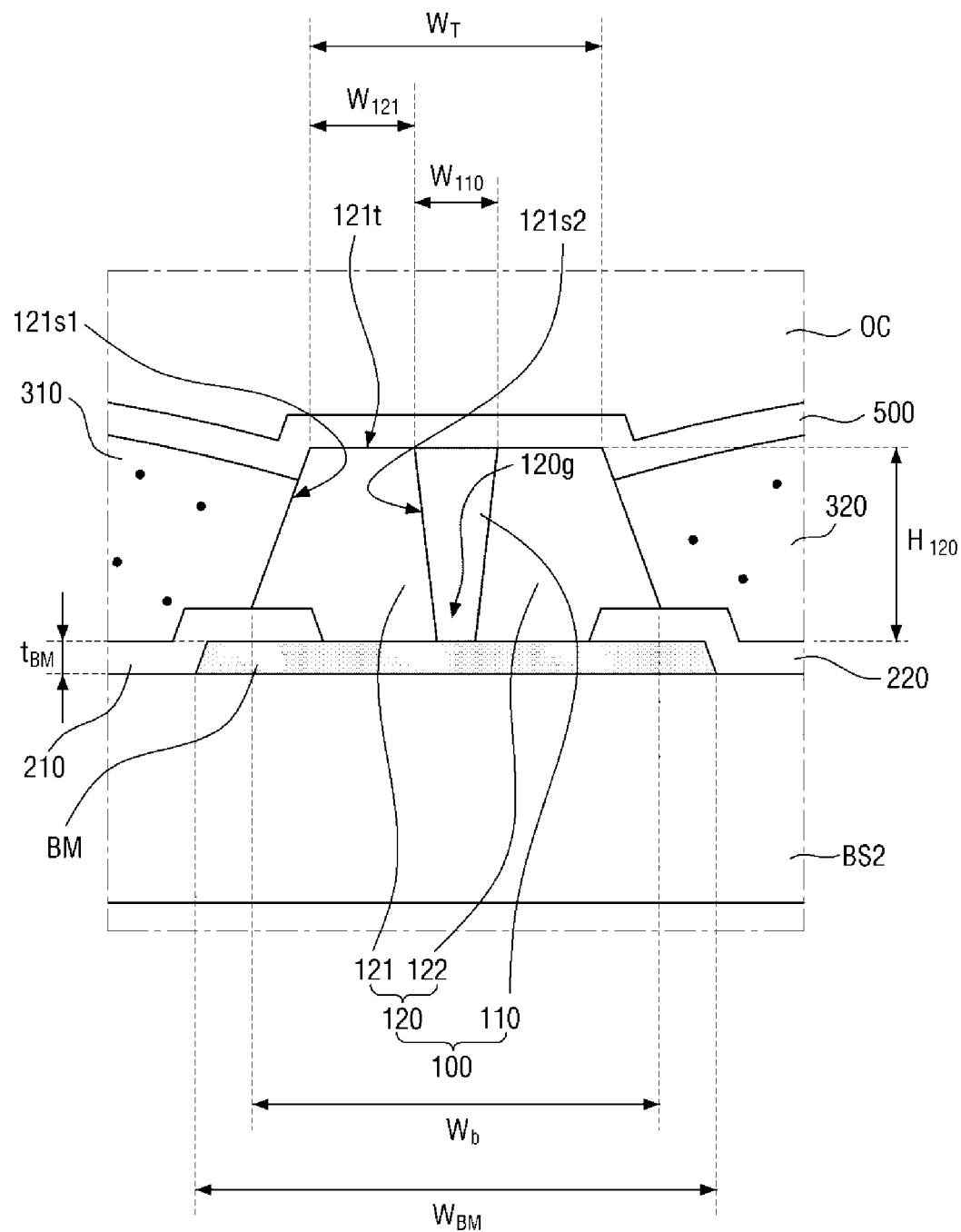
FIG. 5 is an enlarged view of an area A of FIG. 4.
Figure 6:
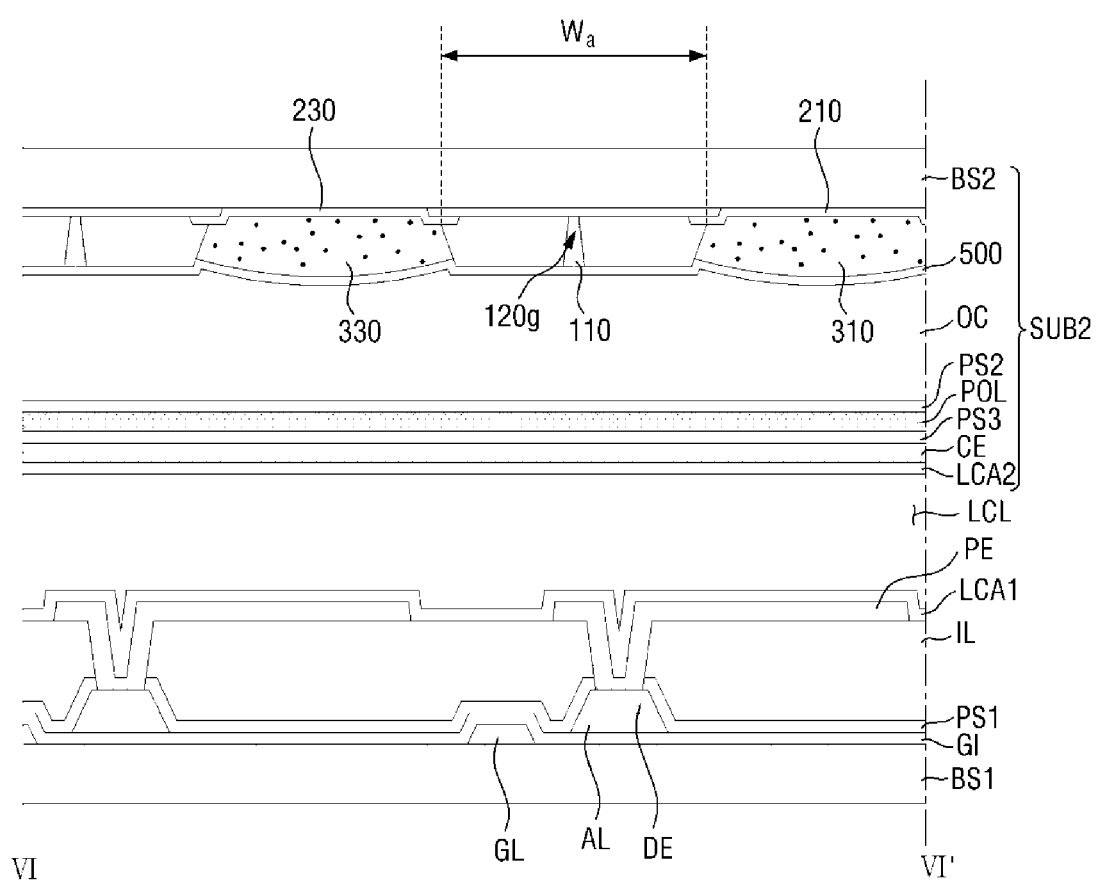
FIG. 6 is a cross-sectional view taken along line VI-VI' of FIG. 2.
Figure 7A:
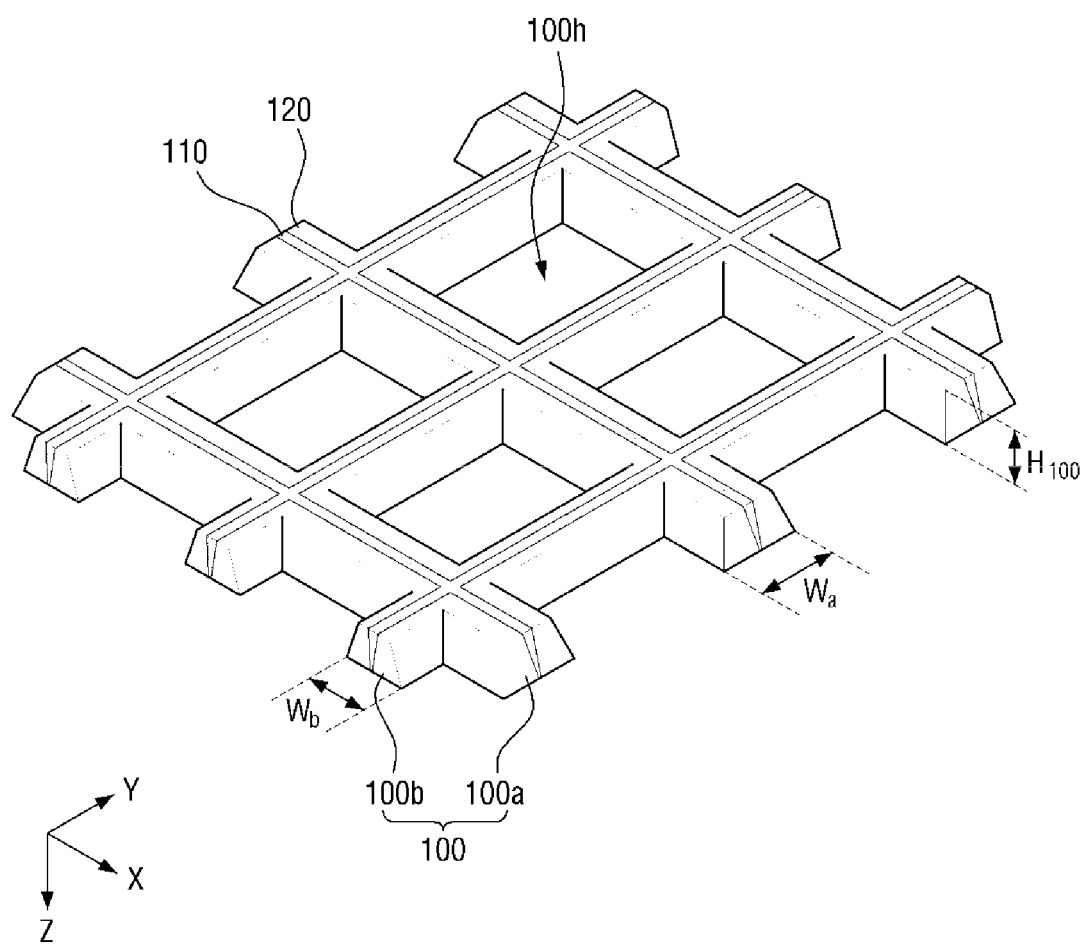
FIG. 7A is a perspective view illustrating a partition wall illustrated in FIGS. 4 and 6.
Figure 7B:
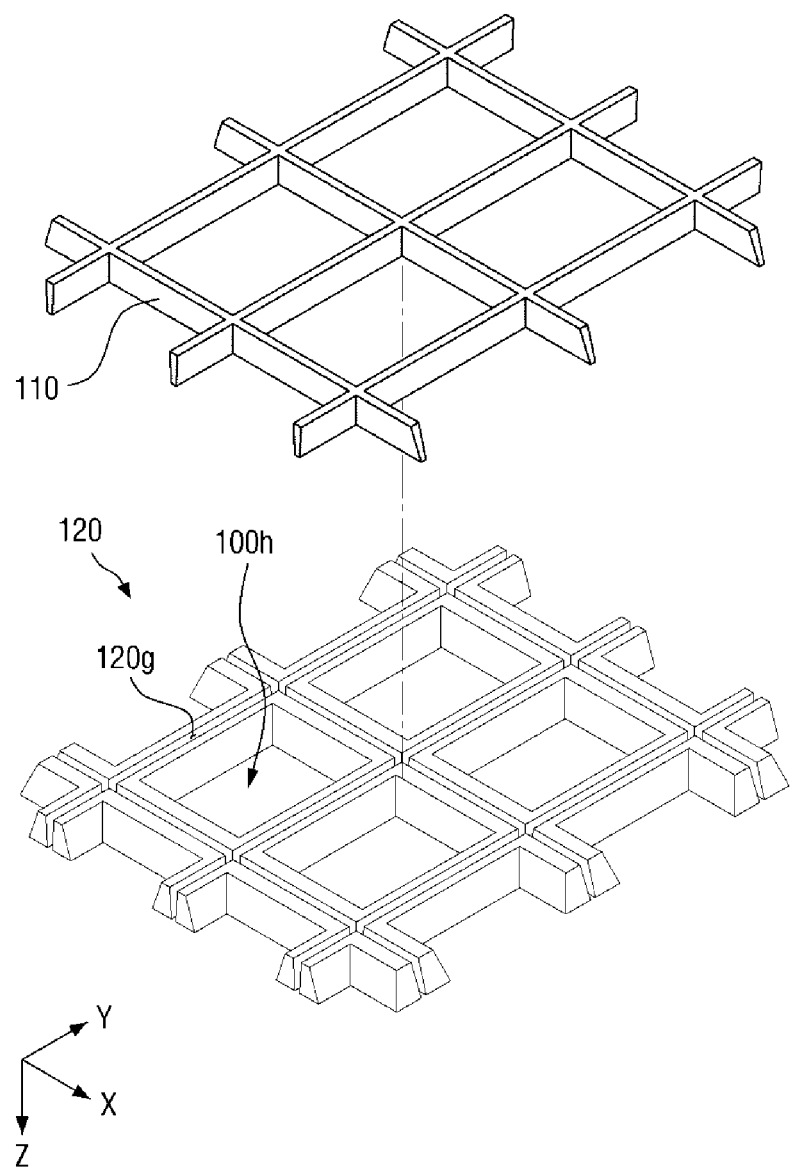
FIG. 7B is an exploded perspective view of the partition wall of FIG. 7A.

FIG. 4 is a cross-sectional view taken along line IV-IV' of FIG. 2. FIG. 5 is an enlarged view of an area A of FIG. 4. FIG. 6 is a cross-sectional view taken along line VI-VI' of FIG. 2. FIG. 7A is a perspective view illustrating a partition wall illustrated in FIGS. 4 and 6. FIG. 7B is an exploded perspective view of the partition wall of FIG. 7A.

The liquid crystal layer LCL will hereinafter be described.

Referring to FIGS. 1 through 4, the liquid crystal layer LCL may include a plurality of liquid crystal molecules LC that are initially aligned. The liquid crystal molecules LC may have negative dielectric anisotropy and may be initially vertically aligned. The liquid crystal molecules LC may have a predetermined pretilt angle in their initial alignment state. The initial alignment of the liquid crystal molecules LC may be induced by the first liquid crystal alignment layer LCA1 and a second liquid crystal alignment layer LCA2. In response to an electric field being formed between the pixel electrode PE and the common electrode CE, the liquid crystal molecules LC may be tilted in a particular direction and may thus change the polarization state of light passing therethrough. Alternatively, the liquid crystal molecules LC may have positive dielectric anisotropy and may be initially horizontally aligned, in which case, in response to an electric field being formed, the liquid crystal molecules LC may change the polarization state of light while rotating.

The second display substrate SUB2 will hereinafter be described.

Referring to FIGS. 1 through 7B, the second display substrate SUB2 may include a second substrate BS2, a partition wall 100, which is disposed on one surface (i.e., the bottom surface in FIG. 4) of the second substrate BS2, color conversion patterns 300, which are disposed on the partition wall 100, and the common electrode CE, which is disposed on the color conversion patterns 300, and may further include a polarizing layer POL, which is disposed between the common electrode CE and the color conversion patterns 300.

The second substrate BS2, like the first substrate BS1, may be a transparent insulating substrate. A light-shielding member BM may be disposed on the second substrate BS2. The light-shielding member BM may block the transmission of light. The light-shielding member BM may be disposed on a plane along the boundaries between adjacent pixels to prevent the occurrence of a color mixing defect between adjacent pixels. The light-shielding member BM may be substantially lattice-shaped in a plan view. A thickness $t_{BM}$ of the light-shielding member BM may have a lower limit of about 1.0 μm, about 1.5 μm, about 2.0 μm, about 2.5 μm, or about 3.0 μm.

First and second wavelength band filters 210 and 220 may be disposed on the light-shielding member BM. The first and second wavelength band filters 210 and 220 are wavelength-selective optical filters that selectively transmit only some of the wavelength band of incident light therethrough by transmitting light of a particular wavelength band therethrough, while blocking the transmission of light of another particular wavelength band. The first wavelength band filter 210 may be disposed in the first pixel PXa, and the second wavelength band filter 220 may be disposed in the second pixel PXb.

In an exemplary embodiment, the first and second wavelength band filters 210 and 220 may selectively transmit therethrough light having a longer peak wavelength than the third color provided by the light source unit 50 and may absorb or reflect light having the third color.

For example, the first wavelength band filter 210 may be disposed in the first pixel PXa, may transmit therethrough light of a wavelength band including the peak wavelength of the first color, and may absorb light of a wavelength band including the peak wavelength of the third color. The first wavelength band filter 210 may partially overlap with the light-shielding member BM.

For example, the second wavelength band filter 220 may be disposed in the second pixel PXb, may transmit therethrough light of a wavelength band including the peak wavelength of the second color, and may absorb light of a wavelength band including the peak wavelength of the third color. The second wavelength band filter 220 may partially overlap with the light-shielding member BM.

The first and second wavelength band filters 210 and 220 may include a colorant or a dye that absorbs light of a particular wavelength band, but the inventive concepts are not limited thereto.

The first wavelength band filter 210 may block the transmission of light not color-converted by, and transmitted directly through, a first color conversion pattern 310, among light of the third color incident upon the first color conversion pattern 310. The second wavelength band filter 220 may block the transmission of light not color-converted by, and transmitted directly through, a second color conversion pattern 320, among light of the third color incident upon the second color conversion pattern 320. Accordingly, the purity of the first color displayed by the first pixel PXa and the purity of the second color displayed by the second pixel PXb can be improved, and as a result, the display quality of the display device 1 can be improved.

A third wavelength band filter 230 may be disposed in the fourth pixel PXd. The third wavelength band filter 230, like the first wavelength band filter 210, may transmit therethrough light of a wavelength band including the peak wavelength of the first color therethrough and may absorb light of a wavelength band including the peak wavelength of the third color. The third wavelength band filter 230 may at least partially overlap with the light-shielding member BM.

The partition wall 100 may be disposed on the first and second wavelength band filters 210 and 220. The partition wall 100 may be disposed to at least partially expose the surface of the second substrate BS. That is, the partition wall 100 may include openings 100h, which at least partially expose the surface of the second substrate BS2. The openings 100h may correspond to the locations of the plurality of pixels.

For example, the partition wall 100 may include a plurality of first portions 100a extending in the first direction X and a plurality of second portions 100b extending in the second direction Y. The first portions 100a and the second portions 100b may intersect each other and may be physically formed in one integral body with each other. That is, in a plan view, the first portions 100a correspond to portions of the partition wall 100 extending in the first direction X, and the second portions 100b correspond to portions of the partition wall 100 extending in the second direction Y. Each of the openings 100h may be defined by being surrounded by a pair of adjacent first portions 100a and a pair of adjacent second portions 100b. In other words, the partition wall 100 may be disposed along the boundaries between the plurality of pixels and may thus be substantially lattice-shaped in a plan view.

In an exemplary embodiment, the first portions 100a overlap with gate electrodes GE, active layers AL, source electrodes SE, drain electrodes DE and contact holes formed in the intermediate layer IL, and the second portions 100b may overlap with data lines DL or the like. A maximum width $W_a$, in the second direction Y, of the first portion 100a may be greater than a maximum width $W_b$, in the first direction X, of the second portions 100b. Also, the width of a lower part of the partition wall 100 (i.e., the maximum width $W_a$, in the second direction Y, of the first portion 100a or the maximum width $W_b$, in the first direction X, of the second portions 100b) may be smaller than a width $W_{BM}$ of the light-shielding member BM.

In a non-limiting example, the width $W_b$ at the bottom of the partition wall 100 may be greater than a width $W_T$ at the top of the partition wall 100. For example, the width $W_b$ at the bottom of the partition wall 100 may be about 17 μm to 30 μm, about 18 μm to 25 μm, or about 20 μm, and the width $W_T$ at the top of the partition wall 100 may be about 15 μm to 25 μm, about 17 μm to 20 μm, or about 18 μm.

In a case where the color conversion patterns 300 are formed by, for example, inkjet printing, the partition wall 100 may help an ink composition for forming the color conversion patterns 300 to be aligned. That is, the partition wall 100 may serve as a guide for accurately ejecting and stably positioning the ink composition at each desired position. In other words, the partition wall 100 can facilitate the formation of the color conversion patterns 300. In order to form the color conversion patterns 300 to have a sufficient thickness, a height $H_{100}$ of the partition wall 100 may have a lower limit of about 7.0 μm, about 7.5 μm, about 8.0 μm, about 8.5 μm, about 9.0 μm, about 9.5 μm, about 10.0 μm, about 10.5 μm, about 11.0 μm, about 11.5 μm, about 12.0 μm, or about 15.0 μm. By setting the height $H_{100}$ of the partition wall 100 to a minimum of about 7.0 μm, the color conversion patterns 300 can be formed to a sufficient thickness, and as a result, color conversion patterns 300 with excellent color conversion efficiency can be obtained.

The partition wall 100 may include a light-transmitting structure 120 having a groove 120g and a first partition wall 110 disposed in the groove 120g. For example, on a cross-section cut in the first direction X or second direction Y, the light-transmitting structure 120 of the partition wall 100 may have inner surfaces facing each other. In an exemplary embodiment, the light-transmitting structure 120 includes second partition wall portions 121 and third partition wall portions 122, which are spaced from the second partition wall portions 121, and the spaces between the inner sides of the second partition wall portions 121 and the inner sides of the third partition wall portions 122 facing the inner sides of the second partition wall portions 121 may define the groove 120g.

The light-transmitting structure 120 may have a light-transmitting property. For example, the light-transmitting structure 120 may have a light transmittance of at least about 90%, at least about 95%, at least about 98%, or at least about 99%. The material of the light-transmitting structure 120 is not particularly limited as long as a material having an excellent light transmittance is used. For example, the material of the light-transmitting structure 120 may be an organic material such as an epoxy resin, an acrylic resin or an imide resin. The light-transmitting structure 120 may be formed of an organic material, particularly, a photosensitive organic material. The photosensitive organic material may be a negative photosensitive material that is cured upon being irradiated with light, but the inventive concepts are not limited thereto. The second partition wall portions 121 and the third partition wall portions 122 of the light-transmitting structure 120 may be formed of the same material or different materials.

Each of the second partition wall portions 121 and the third partition wall portions 122 of the light-transmitting structure 120 may have a top surface and sides inclined downwardly from the top surface. For example, the second partition wall portions 121 may have a top surface 121t, which forms a predetermined flat surface, and outer and inner sides 121s1 and 121s2, which are inclined downwardly from the top surface 121t.

In an exemplary embodiment, the outer surface 121s1 may form an acute angle with respect to the surface of the second substrate BS2. The average inclination angle of the outer surface 121s1 with respect to the surface of the second substrate BS2 may have a lower limit of about 30°, about 35°, or about 40°. The average inclination angle of the outer surface 121s1 with respect to the surface of the second substrate BS2 may have an upper limit of about 85°, about 80°, about 70°, about 60°, or about 50°.

The inclination direction of the outer surface 121s1 may be opposite to the inclination direction of the inner surface 121s2. For example, when the outer surface 121s1 forms a slope having an acute angle with respect to the surface of the second substrate BS2, the inner side 121s2 may also form a slope having an acute angle with respect to the surface of the second substrate BS2. The light-transmitting structure 120 may partially overlap with the first or second wavelength band filter 210 or 220.

The first partition wall portion 110 may be disposed in the groove 120g of the light-transmitting structure 120. In an exemplary embodiment, the first partition wall portion 110 may be in contact with the light-transmitting structure 120.

The first partition wall portion 110 may be formed of a material having a higher optical density than the light-transmitting structure 120. The first partition wall portion 110 may be formed of a material capable of blocking the transmission of light. That is, the first partition wall portion 110 may be a light-blocking partition wall portion. The material of the first partition wall portion 110 is not particularly limited as long as a material capable of blocking the transmission of light is used. For example, the material of the first partition wall portion 110 may be an organic material comprising, for example, a black pigment or dye. The first partition wall portion 110 may include an organic material, particularly, a photosensitive organic material. The photosensitive organic material may be a negative photosensitive material that is cured upon being irradiated with light, but the inventive concepts are not limited thereto.

For example, the optical density of the first partition wall portion 110 may be about 2.0/2 µm or higher, about 3.0/2 µm or higher, or about 4.0/2 µm or higher. That is, the optical density, in a widthwise direction, of the first partition wall portion 110 having a width of 2 µm may be about 2.0 or higher, about 3.0 or higher, or about 4.0 or higher. The first partition wall portion 110 may be formed of the substantially same material as, or a different material from, the light-shielding member BM.

The first partition wall portion 110 may be disposed between the first and second color conversion patterns 310 and 320, which are spaced apart from each other in a horizontal direction (for example, the first direction X), and between the second color conversion pattern 320 and a light-transmitting pattern 400, which are also spaced apart from each other in the horizontal direction (for example, the first direction X).

The height of the first partition wall portion 110 may be substantially the same as the height $H_{100}$ of the partition wall 100. For example, the height of the first partition wall portion 110 may have a lower limit of about 7.0 µm, about 7.5 µm, about 8.0 µm, about 8.5 µm, about 9.0 µm, about 9.5 µm, about 10.0 µm, about 10.5 µm, about 11.0 µm, about 11.5 µm, about 12.0 µm, or about 15.0 µm. By setting the height of the first partition wall portion 110 to a minimum of about 7.0 µm, the transmission of light between the first and second color conversion patterns 310 and 320 can be blocked. The width of the first partition wall portion 110 is not particularly limited as long as the first partition wall portion 110 can completely block the transmission of light. For example, the minimum width of the first partition wall portion 110 may have a lower limit of about 1.0 µm, about 1.5 µm, about 2.0 µm, about 2.5 µm, or about 3.0 µM.

As the first partition wall portion 110 has a sufficient height (i.e., the height $H_{100}$), a phenomenon in which light of the first color emitted by a first wavelength shift material 310p contained in the first color conversion pattern 310 travels into the second color conversion pattern 320 to cause the first color to be displayed in the second pixel PXb, i.e., a light leakage defect, can be suppressed.

A maximum width $W_{110}$ of the first partition wall portion 110 overlapping with the light-shielding member BM may be smaller than a maximum width $W_{BM}$ of the light-shielding member BM. The maximum width $W_{110}$ of the first partition wall portion 110 may refer to the maximum width of the groove 120g of the light-transmitting structure 120. In some exemplary embodiments, a minimum spacing distance $L_{100}$, in the first direction X, between adjacent portions of the partition wall 100 may be greater than the maximum width $W_{110}$ of the groove 120g of the light-transmitting structure 120.

In an exemplary embodiment, the width $W_{121}$ of the top surface 121t of each of the second partition wall portions 121 may be substantially the same as the width of the top surface of each of the third partition wall portions 122. In this exemplary embodiment, the ratio of the width $W_{121}$ of the top surface 121t of each of the second partition wall portions 121 to the width $W_{110}$ of the top surface of the first partition wall portion 110 may be in the range of about 1:2 to 2:1. The width $W_{110}$ of the top surface of the first partition wall portion 110 may be greater than the width of the bottom surface of the first partition wall portion 110 (i.e., the minimum width of the first partition wall portion 110).

Conventionally, it is almost impossible or highly complicated to form a light-shielding member to a sufficient thickness (or height) using a photosensitive material because, due to the absorbance characteristics of the light-shielding member itself, it is difficult to expose and cure the light-shielding member. For example, in the prior art, when a material having a high absorbance is used, a light-shielding member cannot be formed to a thickness (or height) greater than 1.0 µm, and when a material having a low absorbance is used, a light-shielding member cannot fully exhibit its light-shielding characteristics and may cause a light leakage defect.

On the other hand, in the display device 1, the light-transmitting structure 120 with a sufficient height is formed, and the first partition wall portion 110 with a relatively high optical density is disposed in the groove 120a. Accordingly, a relatively large height can be secured for the first partition wall portion 110 having absorbance, and as a result, the occurrence of a light leakage defect between adjacent pixels can be suppressed.

The color conversion patterns 300 may be disposed on the partition wall 100. The color conversion patterns 300 can convert the color of light transmitted therethrough into a different color from light incident thereupon. That is, light may be converted into light of a particular wavelength band by being transmitted through the color conversion patterns 300. In an exemplary embodiment, the color conversion patterns 300 may include a material capable of converting or shifting the peak wavelength of incident light to a predetermined peak wavelength, i.e., a wavelength shift material (310p and 320p). Examples of the wavelength shift material (310p and 320p) include a quantum dot material and a fluorescent material.

For example, quantum dots can emit a particular color as the electrons transition from a conduction band to a valence band. The quantum dot material may have a core-shell structure. The core may be a semiconductor nanocrystalline material. Examples of the core of the quantum dot material include silicon (Si)-based nanocrystals, II-VI group compound nanocrystals, and III-V group compound nanocrystals, but the inventive concepts are not limited thereto. In a non-limiting example, the wavelength shift material may include a core formed of cadmium selenide (CdSe), cadmium telluride (CdTe), cadmium sulfide (CdS), or indium phosphide (InP) and a shell formed of zinc sulfide (ZnS).

In a case where the color conversion patterns 300 include the wavelength shift material (310p and 320p), at least some of light transmitted through the color conversion patterns 300 to travel in the third direction Z can contribute to the emission of light by the wavelength shift material (310p and 320p). In order to enhance the contribution of light transmitted through the color conversion patterns 300 to the emission of light by the wavelength shift material (310p and 320p), the color conversion patterns 300 may have a sufficient thickness $t_{300}$. For example, the thickness $t_{300}$ of the color conversion patterns 300 may have a lower limit of about 7.0 µm, about 7.5 µm, about 8.0 µm, about 8.5 µm, about 9.0 µm, about 9.5 µm, about 10.0 µm, about 10.5 µm, about 11.0 µm, about 11.5 µm, about 12.0 µm, or about 15.0 µm. As described above, by forming the partition wall 100 to a sufficient height, the formation of the color conversion patterns 300 having a sufficient thickness can be facilitated.

The color conversion patterns 300 may include the first and second color conversion patterns 310 and 320. The first color conversion pattern 310 may be disposed in an opening 100h formed in the first pixel PXa by the partition wall 100, and the second color conversion pattern 320 may be disposed in an opening 100h formed in the second pixel PXb by the partition wall 100.

The first color conversion pattern 310 may include the first wavelength shift material 310p. The first wavelength shift material 310p may be a material that emits light having the same peak wavelength as the first color. The first wavelength shift material 310p may have a particle size of about 55 Å to about 65 Å, but the inventive concepts are not limited thereto. The second color conversion pattern 320 may include a second wavelength shift material 320p. The second wavelength shift material 320p may be a material that emits light having the same peak wavelength as the second color. The second wavelength shift material 320p may have a particle size of about 40 Å to 50 Å, but the inventive concepts are not limited thereto.

The first and second wavelength shift materials 310p and 320p emit light in various directions regardless of the incidence angle of incident light and can thus contribute to the improvement of the side visibility of the first and second colors displayed by the display device 1. Light emitted from the first and second wavelength shift materials 310p and 320p toward a viewer's side (i.e., toward an upper side in FIG. 4) may be depolarized and may thus be in an unpolarized state. As used herein, the term "unpolarized light" denotes light not consisting only of polarization components in a particular direction, i.e., light consisting of randomly polarized components. An example of unpolarized light is natural light.

The first partition wall portion 110 of the partition wall 100 may be interposed between the first and second color conversion patterns 310 and 320, which are spaced apart from each other in the horizontal direction (for example, the first direction X).

By placing the first partition wall portion 110, which has sufficient absorbance characteristics, between the first and second color conversion patterns 310 and 320, a phenomenon in which light emitted by the first wavelength shift material 310p travels toward the second color conversion pattern 320 to cause the first color to be displayed in the second pixel PXb or a phenomenon in which light emitted by the second wavelength shift material 320p travels toward the first color conversion pattern 310 to cause the second color to be displayed in the first pixel PXa can be suppressed.

The light-transmitting pattern 400 may be disposed in an opening 100h formed in the third pixel PXc by the partition wall 100. For example, the light-transmitting pattern 400 may be disposed directly on the second substrate BS2 and on the partition wall 100. The light-transmitting pattern 400 may transmit incident light therethrough without converting the color of the incident light. That is, light transmitted through the light-transmitting pattern 400 may have the same color as light provided by the light source unit 50, i.e., the third color.

In some exemplary embodiments, the light-transmitting pattern 400 may further include a particle material 400p dispersed therein. The particle material 400p may be a light scattering material that induces the scattering of light transmitted through the light-transmitting pattern 400. The type of the particle material 400p is not particularly limited as long as it can scatter and reflect light. For example, the particle material 400p may be particles of a metal oxide or particles of an organic material. Examples of the metal oxide include titanium oxide, zirconium oxide, aluminum oxide, indium oxide, zinc oxide, and tin oxide, and examples of the organic material include an acrylic resin and a urethane resin.

The particle material 400p may scatter light having the third color, provided by the light source unit 50 and transmitted through the light-transmitting pattern 400, in various directions, regardless of the incidence angle of the light, without changing the wavelength of the corresponding light, and may thus improve the side visibility of the third color displayed by the display device 1. Light transmitted through the light-transmitting pattern 400 to the viewer's side may be unpolarized light. Alternatively, the light-transmitting pattern 400 may not be provided.

The first partition wall portion 110 of the partition wall 100 may be interposed between the second color conversion pattern 320 and the light-transmitting pattern 400, which are spaced apart from each other in the horizontal direction (for example, the first direction X).

By placing the first partition wall portion 110, which has sufficient absorbance characteristics, between the second color conversion pattern 320 and the light-transmitting pattern 400, a phenomenon in which light emitted by the second wavelength shift material 320p travels toward the light-transmitting pattern 400 to cause the second color to be displayed in the third pixel PXc or a phenomenon in which light scattered by the particle material 400p of the light-transmitting pattern 400 travels toward the second color conversion pattern 320 to cause the second color to be displayed in the first pixel PXa can be suppressed.

The color conversion patterns 300 may further include a third color conversion pattern 330. The third color conversion pattern 330 may be disposed in an opening 100h formed in the fourth pixel PXd by the partition wall 100. The third color conversion pattern 330 may include a wavelength shift material that emits light having the same peak wavelength as the first color. In this case, the first partition wall portion 110 of the partition wall 100 may be interposed between the first and third color conversion patterns 310 and 330, which are spaced apart from each other in the horizontal direction (e.g., the second direction Y). A fourth wavelength band filter 500 may be disposed on the color conversion patterns 300 and the light-transmitting pattern 400. The fourth wavelength band filter 500 is a wavelength-selective optical filter that selectively transmits only some of the wavelength band of incident light therethrough by transmitting light of a particular wavelength band therethrough, while blocking the transmission of light of another particular wavelength band.

In an exemplary embodiment, the fourth wavelength band filter 500 may selectively reflect light having a peak wavelength longer than the third color provided by the light source section 50 and may selectively transmit light having the third color therethrough. For example, the fourth wavelength band filter 500 may selectively reflects light of a wavelength band including the peak wavelength of the first color and light of a wavelength band including the peak wavelength of the second color and may selectively transmit light of a wavelength band including the peak wavelength of the third color. The fourth wavelength band filter 500 may include one or more layers formed of an inorganic material. For example, the fourth wavelength band filter 500 may have a stack structure in which a plurality of low refraction layers and a plurality of high refraction layers are alternately stacked. As used herein, the term "low refraction layer" refers to a layer having a lower refractive index than its neighboring layers, and term "high refraction layer" refers to a layer having a higher refractive index than its neighboring layers. The transmission wavelength band and the reflection wavelength band of the fourth wavelength band filter 500 may be controlled by the materials of the low refraction layers and the high refraction layers, the thicknesses of the low refraction layers and the high refraction layers and differences therebetween, and the refractive indexes of the low refraction layers and the high refraction layers and differences therebetween.

The fourth wavelength band filter 500 may be formed along the outer sides of the first and second color conversion patterns 310 and 320, the light-transmitting pattern 400, and the partition wall 100 to have a substantially uniform thickness. The fourth wavelength band filter 500 may have an average thickness of about 0.5 μm to 2.0 μm or about 1.0 μm. In an exemplary embodiment, the fourth wavelength band filter 500 may be in contact with the light-transmitting structure 120 and the first partition wall portion 110 of the partition wall 100 at the same time.

The fourth wavelength band filter 500 can contribute to the display of a color by reflecting light emitted there toward (i.e., toward a lower side in FIG. 4), among light emitted in various directions by the first and second wavelength shift materials 310p and 320p, toward the viewer's side. Thus, the utilization efficiency of light can be enhanced, and the display device 1 can vividly display colors. Also, the fourth wavelength band filter 500 can further improve the color purity of light provided by the light source unit 50 by transmitting light having the same peak wavelength as the third color therethrough and blocking the transmission of light having a longer peak wavelength than the third color.

An overcoat layer OC may be disposed on the fourth wavelength band filter 500. The overcoat layer OC may be a planarization layer that minimizes any height differences between the components stacked on the second substrate BS2. The overcoat layer OC may include one or more layers. For example, the overcoat layer OC may have a stack of a plurality of layers. The overcoat layer OC may be formed of an organic material having planarization characteristics. For example, the overcoat layer OC may be formed of an organic material such as a cardo resin, a polyimide resin, or an acrylic resin. The overcoat layer OC may be disposed directly on the fourth wavelength band filter 500 without regard to the distinction between the plurality of pixels (including the first, second, and third pixels PXa, PXb, and PXc).

The polarizing layer POL may be disposed on the overcoat layer OC. The polarizing layer POL may perform an optical shutter function together with the liquid crystal layer LCL and another polarizing layer (not illustrated) disposed between the liquid crystal layer LCL and the light source portion 50 to control the amount of transmitted light for each of the plurality of pixels (including the first, second, and third pixels PXa, PXb, and PXc). In an exemplary embodiment, the polarizing layer POL may be a reflective polarizing element having wire grid patterns. As used herein, the term "wire grid patterns" means a plurality of linear patterns extending in parallel to be spaced apart from each other. The reflective polarizing element transmits polarized components parallel to the transmission axis thereof and reflects polarized components parallel to the reflection axis thereof, thereby polarizing transmitted light. In another exemplary embodiment, the polarizing layer POL may include a coating-type polarizing element.

The wire grid patterns of the polarizing layer POL may be formed of a material having reflection characteristics. For example, the wire grid patterns of the polarizing layer POL may be formed of aluminum (Al), silver (Ag), gold (Au), copper (Cu), titanium (Ti), molybdenum (Mo), nickel (Ni), or an alloy thereof.

In some exemplary embodiments, a second passivation layer PS2 may be disposed between the overcoat layer OC and the polarizing layer POL. The second passivation layer PS2 may be in contact with the overcoat layer OC and the wire grid patterns of the polarizing layer POL at the same time. The second passivation layer PS2 may be formed of an inorganic material such as silicon nitride or silicon oxide. The second passivation layer PS2 may prevent the overcoat layer OC from being damaged during the formation of the wire grid patterns of the polarizing layer POL. Also, the second passivation layer PS2 may improve the attachability of the wire grid patterns of the polarizing layer POL and may prevent the wire grid patterns of the polarizing layer POL from being damaged or corroded by air or moisture, thereby improving the reliability of the display device 1.

A third passivation layer PS3 may be disposed on the polarizing layer POL. The third passivation layer PS3 may be disposed directly on the polarizing layer POL to cover and protect the wire grid patterns of the polarizing layer POL. The third passivation layer PS3 may prevent the wire grid patterns of the polarizing layer POL from being damaged or corroded by air or moisture and may planarize the top surface of the polarizing layer POL. The third passivation layer PS3 may be formed of an inorganic material such as silicon nitride or silicon oxide.

The common electrode CE may be disposed on the third passivation layer PS3. The common electrode CE may be formed in one integral body without regard to the distinction between the plurality of pixels (including the first, second, and third pixels PXa, PXb, and PXc) and may receive a common voltage. In an exemplary embodiment, the common electrode CE may be disposed directly on the third passivation layer PS3 and may be a transparent electrode. The second liquid crystal alignment layer LCA2 may be disposed on the common electrode CE and may induce the initial alignment of the liquid crystal molecules LC in the liquid crystal layer LCL. The second liquid crystal alignment layer LCA2 may include the same polymer organic material as, or a different polymer organic material from, the first liquid crystal alignment layer LCA1.

Figure 8:
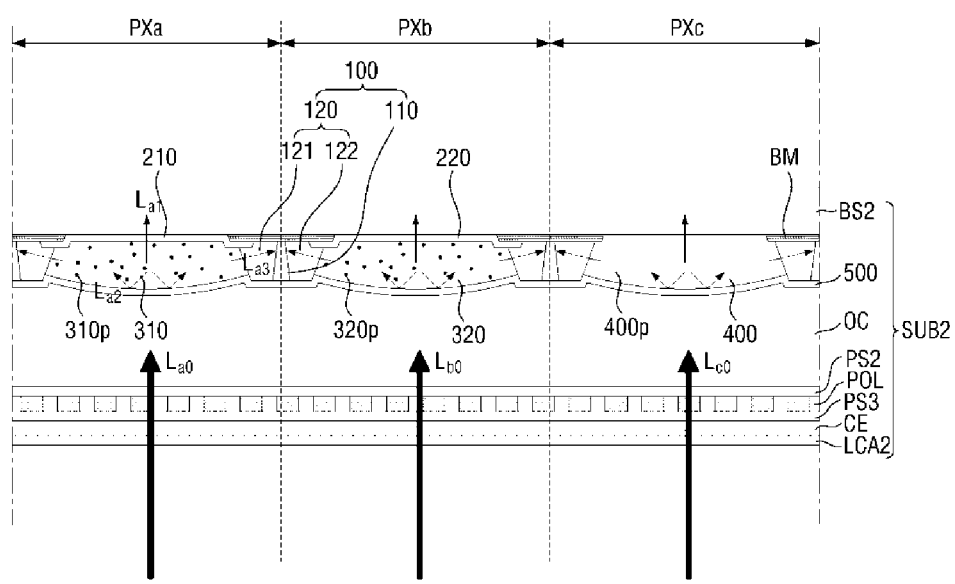
FIG. 8 is a cross-sectional view illustrating the path of light transmitted through a second display substrate of FIG. 4.
Figure 8:
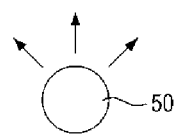

The realization of a color by the display device 1 will hereinafter be described with reference to FIG. 8. FIG. 8 is a cross-sectional view illustrating the path of light transmitted through the second display substrate of FIG. 4.

Referring to FIGS. 1 through 8, the light source unit 50 provides light of the third color to the display panel 31. In an exemplary embodiment, the light source unit 50 may provide light of the third color having a peak wavelength of about 430 nm to 470 nm to the display panel 31.

Among the light of the third color provided by the light source unit 50, light $L_{a0}$ incident upon the first pixel PXa of the display panel 31 may pass through the fourth wavelength band filter 500 and may be emitted in various directions, regardless of the incidence angle thereof, after being converted or shifted to the peak wavelength of the first color by the first wavelength shift material 310p.

Specifically, among light emitted by the first wavelength shift material 310p, light $L_{a1}$ emitted toward the second substrate BS2 (i.e., toward an upper side in FIG. 8) may pass through the first wavelength band filter 210 and may contribute to the display of the first color in the first pixel PXa.

Among the light emitted by the first wavelength shift material 310p, light $L_{a1}$ emitted toward the fourth wavelength band filter 500 (i.e., toward a lower side in FIG. 8) may be reflected by the fourth wavelength band filter 500 and may contribute to the display of the first color in the first pixel PXa.

Among the light emitted by the first wavelength shift material 310p, light $L_{a1}$ emitted toward the second color conversion pattern 320 (i.e., toward a left or right side in FIG. 8) may be absorbed by the first partition wall portion 110 of the partition wall 100 disposed between the first and second color conversion patterns 310 and 320, and as a result, a light leakage defect may be prevented.

Similarly, among the light of the third color provided by the light source unit 50, light $L_{b0}$ incident upon the second pixel PXb of the display panel 31 may be converted or shifted to the peak wavelength of the second color by the second wavelength shift material 320p and may contribute to the display of the second color in the second pixel PXb.

Among the light of the third color provided by the light source unit 50, light $L_{c0}$ incident upon the third pixel PXc of the display panel 31 may pass through the fourth wavelength band filter 500 and then the light-transmitting pattern 400 and may contribute to the display of the third color in the third pixel PXc.

Display devices according to other exemplary embodiments of the inventive concepts will hereinafter be described. In FIGS. 1 through 15, like reference numerals indicate like elements, and thus, detailed descriptions thereof will be omitted.

Figure 9A:
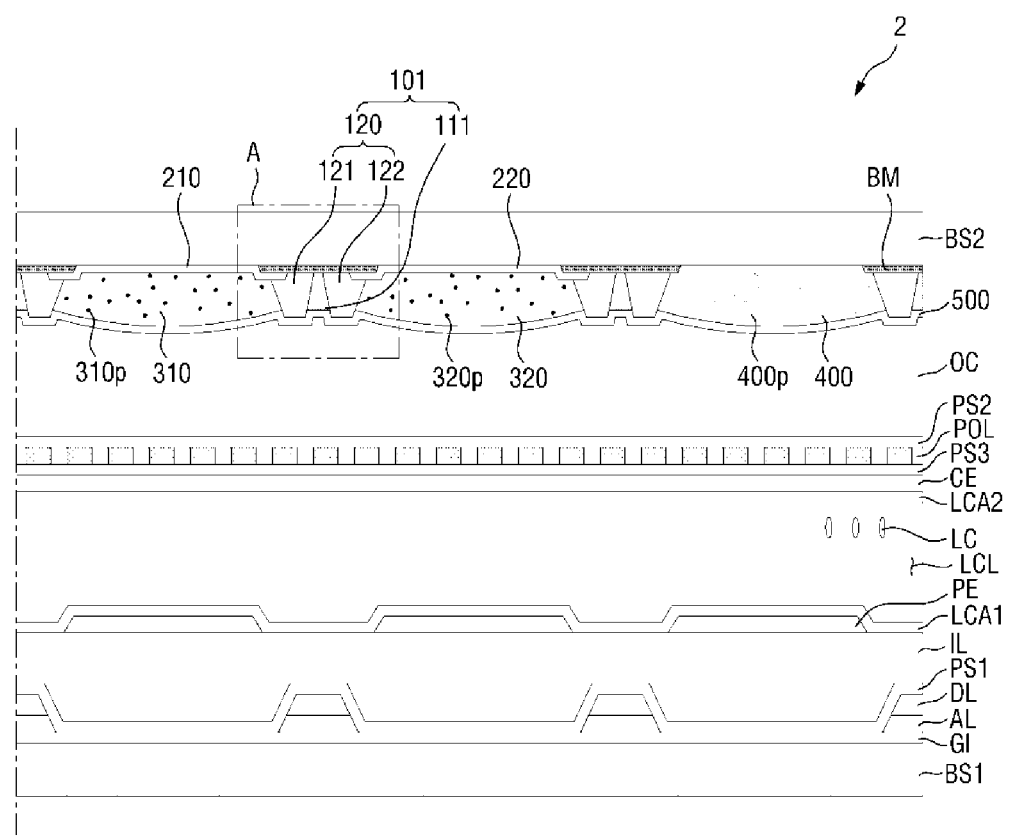
FIG. 9A and FIG. 9B are cross-sectional views of a display device according to another exemplary embodiment of the inventive concepts.
Figure 9B:
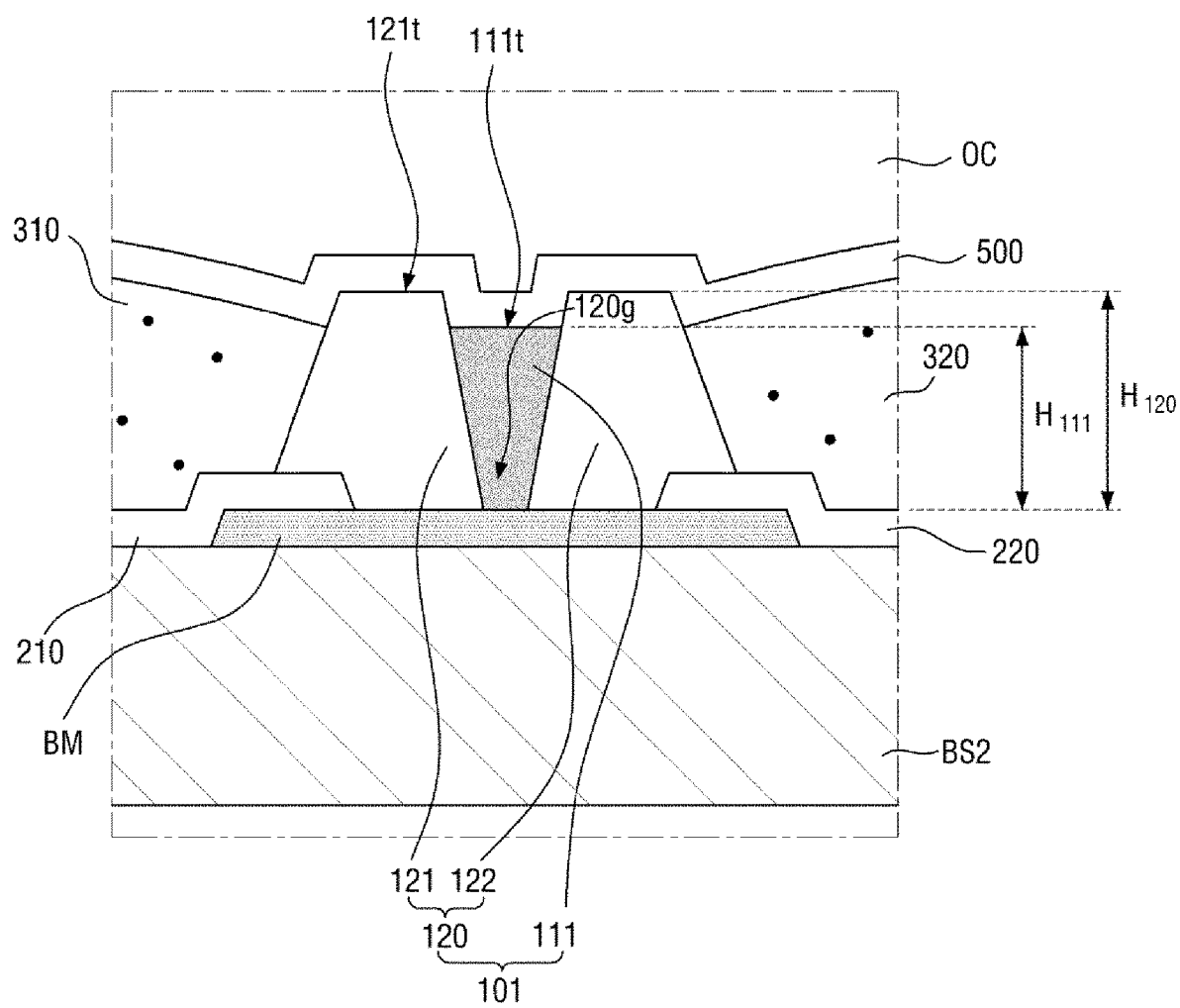

FIGS. 9A and 9B are cross-sectional views of a display device according to another exemplary embodiment of the inventive concepts. Specifically, FIG. 9A is a cross-sectional view corresponding to FIG. 4, and FIG. 9B is an enlarged cross-sectional view of an area A of FIG. 9A.

Referring to FIGS. 9A and 9B, a display device 2 differs from the display device 1 of FIG. 1 in that a height $H_{111}$ of a first partition wall portion 111 is different from a height $H_{120}$ of a light-transmitting structure 120.

In an exemplary embodiment, the height $H_{111}$ of the first partition wall portion 111 may be smaller than the height $H_{120}$ of the light-transmitting structure 120. That is, the first partition wall portion 111 may not completely fill a groove 120g of the light-transmitting structure 120.

For example, the height $H_{111}$ of the first partition wall portion 111 may have an upper limit of about 7.0 μm, about 7.5 μm, about 8.0 μm, about 8.5 μm, about 9.0 μm, about 9.5 μm, about 10.0 μm, about 10.5 μm, about 11.0 μm, about 11.5 μm, about 12.0 μm, or about 15.0 μm, and the lower limit of the height $H_{120}$ of the light-transmitting structure 120 may be greater than the upper limit of the height $H_{111}$ of the first partition wall portion 111.

A fourth wavelength band filter 500 may be formed along the outer sides of the first and second color conversion patterns 310 and 320, the light-transmitting pattern 400, and the partition wall 100 to have a substantially uniform thickness. In an exemplary embodiment, the fourth wavelength band filter 500 may be in contact with the light-transmitting structure 120 and the first partition wall portion 111 of a partition wall 101 at the same time.

Specifically, since the height $H_{111}$ of the first partition wall portion 111 is less than the height $H_{120}$ of the light-transmitting structure 120, the inner sides of second partition wall portions 121 of the light-transmitting structure 120 and the inner sides of third partition wall portions 122 of the light-transmitting structure 120 may be partially exposed. In this case, the fourth wavelength band filter 500 may be in contact with the inner sides of the second partition wall portions 121 and the inner sides of the third partition wall portions 122.

Figure 10A:
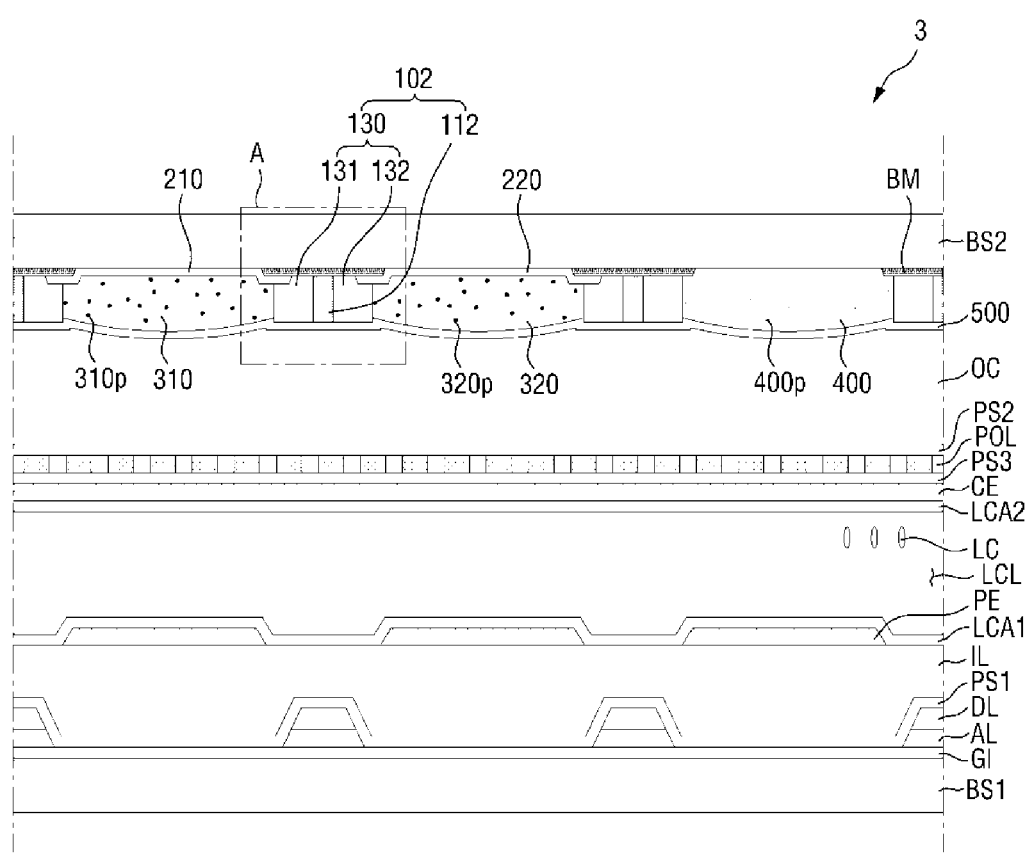
FIG. 10A, FIG. 10B, FIG. 11A, FIG. 11B, FIG. 12A, FIG. 12B, FIG. 13A, FIG. 13B, FIG. 14A, FIG. 14B, and FIG. 15 are cross-sectional views of display devices according to other exemplary embodiments of the inventive concepts.
Figure 10B:
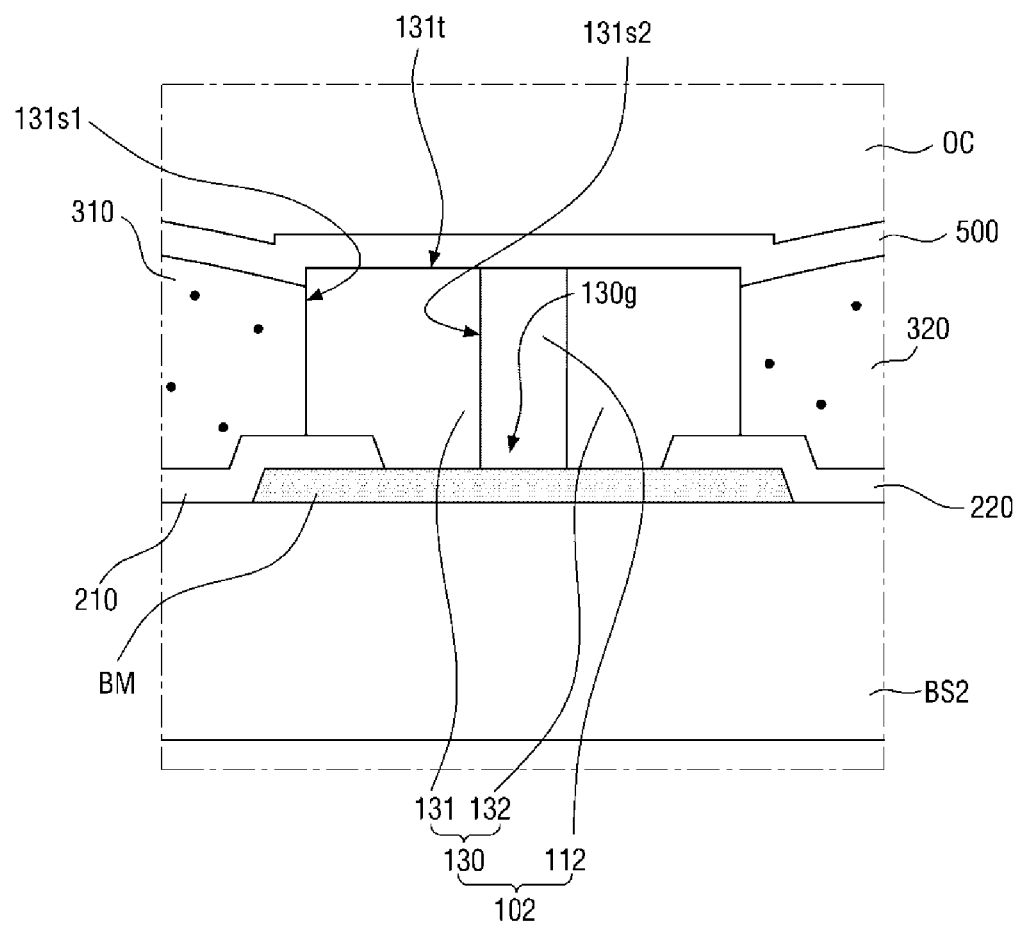

FIGS. 10A and 10B are cross-sectional views of a display device according to another exemplary embodiment of the inventive concepts. Specifically, FIG. 10A is a cross-sectional view corresponding to FIG. 4, and FIG. 10B is an enlarged cross-sectional view of an area A of FIG. 10A.

Referring to FIGS. 10A and 10B, a display device 3 differs from the display device 1 of FIG. 1 in that sides of a partition wall 102 are substantially perpendicular to the surface of a second substrate BS2.

In an exemplary embodiment, the partition wall 102 may include a light-transmitting structure 130 having a groove 130g and a first partition portion 112 disposed in the groove 130g. The light-transmitting structure 130 may include second partition wall portions 131 and third partition wall portions 132, which have inner sides facing the inner sides of the second partition wall portions 131. Each of the second partition wall portions 131 and the third partition wall portions 132 may have a top surface and sides connected to the top surface. For example, each of the second partition wall portions 131 may have a top surface 131t, which forms a predetermined flat surface, and outer and inner sides 131s1 and 131s2, which are connected to the top surface 131t. The outer side 131s1 may be in contact with a first color conversion pattern 310, but the inventive concepts are not limited thereto. The inner side 131s2 may be in contact with the first partition wall portion 112, but the inventive concepts are not limited thereto.

If the outer side 131s1 is substantially perpendicular to the surface of the second substrate BS2, the inner side 131s2 may also be substantially perpendicular to the surface of the second substrate BS2.

The first partition wall portion 112 may be disposed in the groove 130g of the light-transmitting structure 130. If the inner side 131s2 of each of the second partition wall portions 131 and the inner side of each of the third partition wall portions 132 are both perpendicular to the surface of the second substrate BS2, the width of the top surface of the first partition wall portion 112 may be substantially the same as the width of the bottom surface of the first partition wall portion 112.

Since the sides of the partition wall 102 are substantially perpendicular to the surface of the second substrate BS2, the display device 3 can enhance the light utilization efficiency of first and second color conversion patterns 310 and 320. Specifically, the overlapping area, in a plan view, of the first or second color conversion pattern 310 or 320 and a light-shielding member BM can be minimized. As a result, the amount of light blocked by the light-shielding member BM can be minimized, and thus, the display device 3 can vividly display colors.

Figure 11A:
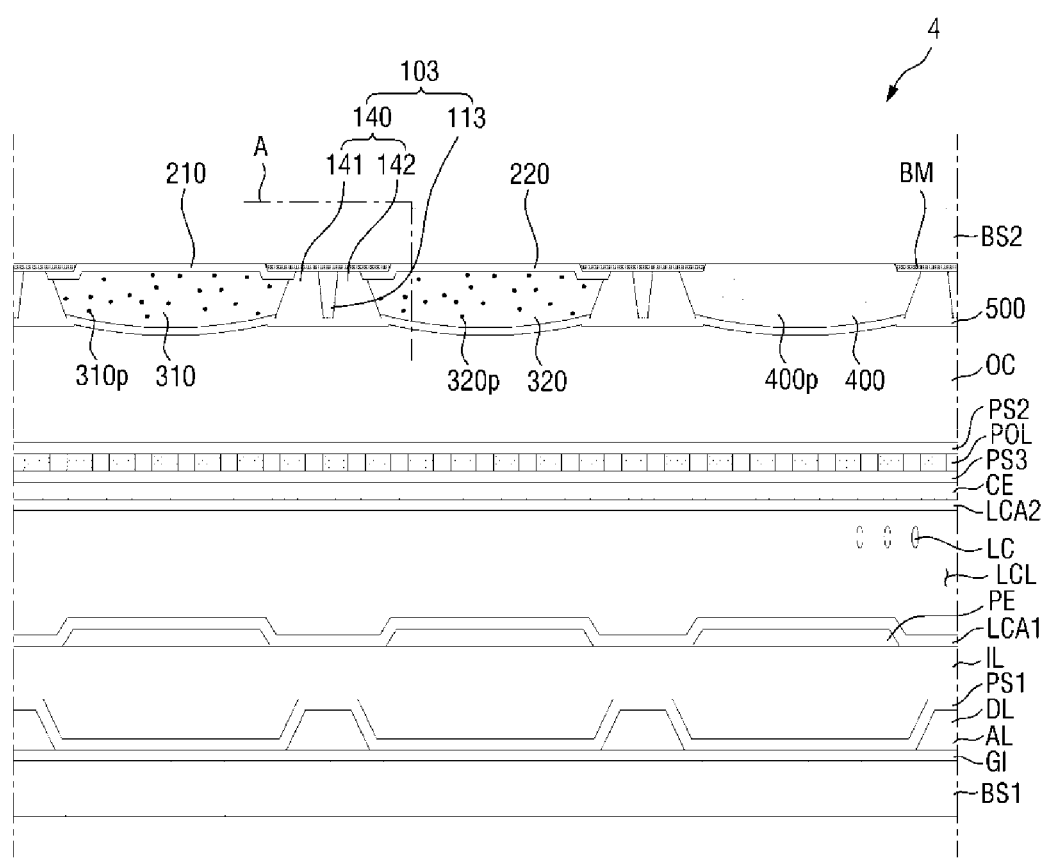
Figure 11B:
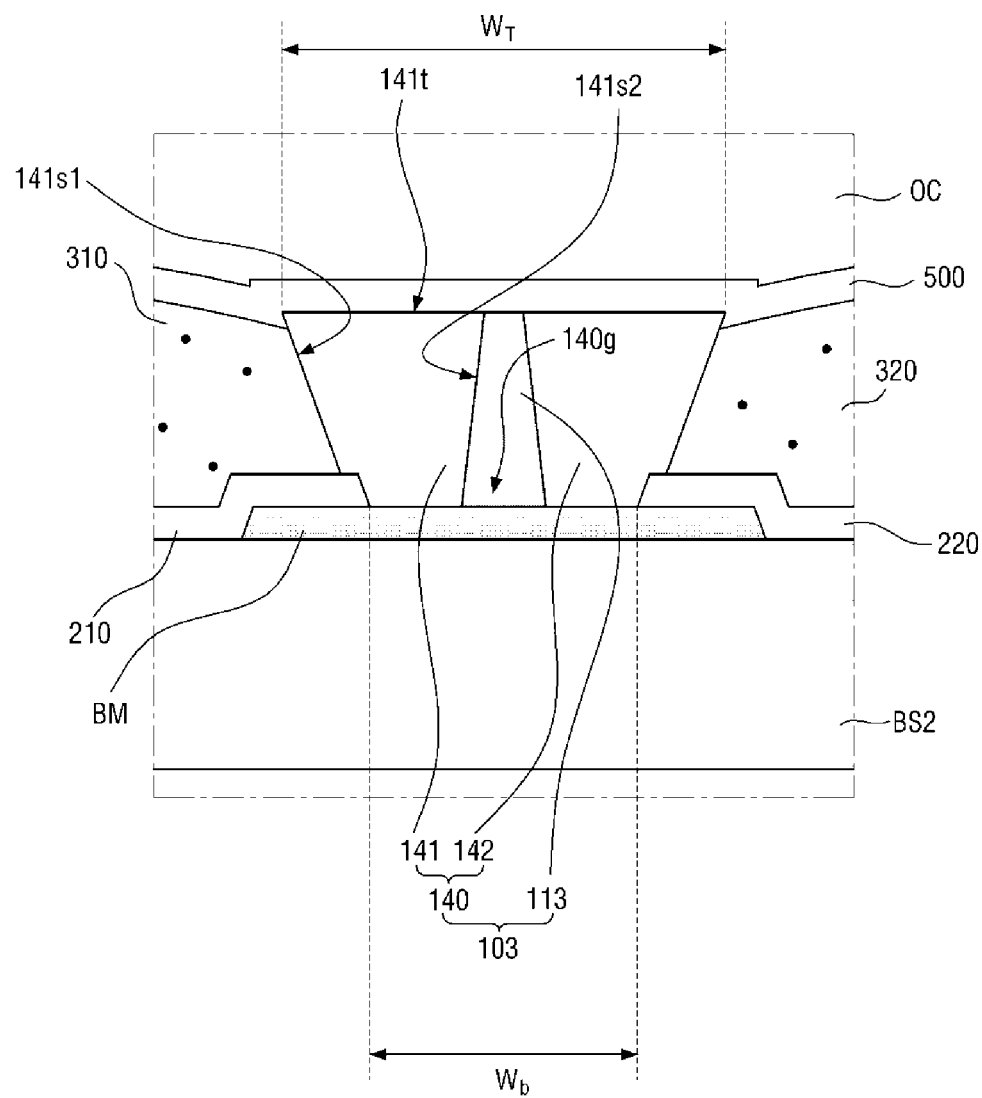

FIGS. 11A and 11B are cross-sectional views of a display device according to another exemplary embodiment of the inventive concepts. Specifically, FIG. 11A is a cross-sectional view corresponding to FIG. 4, and FIG. 11B is an enlarged cross-sectional view of an area A of FIG. 11A.

Referring to FIGS. 11A and 11B, a display device 4 differs from the display device 1 of FIG. 1 in that a width $W_T$ of the top surface of a partition wall 103 is greater than a width $W_b$ of the bottom surface of the partition wall 103.

In an exemplary embodiment, the partition wall 103 may include a light-transmitting structure 140 having a groove 104g and a first partition wall portion 113 disposed in the groove 140g. The light-transmitting structure 140 may include second partition wall portions 141 and third partition wall portions 142, which have inner sides facing the inner sides of the second partition wall portions 141. Each of the second partition wall portions 141 and the third partition wall portions 142 may have a top surface and sides inclined downwardly from the top surface. For example, each of the second partition wall portions 141 may have a top surface 141t, which forms a predetermined flat surface, and outer and inner sides 141s1 and 141s2, which are inclined downwardly from the top surface 141t.

In a non-limiting example, the outer surface 141s1 may form an obtuse angle with respect to the surface of a second substrate BS2. The average inclination angle of the outer surface 141s1 with respect to the surface of the second substrate BS2 may have a lower limit of about 100°, about 110°, or about 120°. The average inclination angle of the outer surface 141s1 with respect to the surface of the second substrate BS2 may have an upper limit of about 160°, about 150°, or about 140°.

The inclination direction of the outer surface 141s1 may be opposite to the inclination direction of the inner surface 141s2. For example, when the outer surface 141s1 forms a slope having an obtuse angle with respect to the surface of the second substrate BS2, the inner side 141s2 may also form a slope having an obtuse angle with respect to the surface of the second substrate BS2. The light-transmitting structure 140 may be at least partially in contact with a first or second wavelength band filter 210 or 220 and may at least partially overlap with the first or second wavelength band filter 210 or 220.

The first partition wall portion 113 may be disposed in the groove 140g. If the inner side 141s2 of each of the second partition wall portions 141 and the inner side of each of the third partition wall portions 142 both have an adverse slope, as illustrated in FIG. 11B, the width of the top surface of the first partition wall portion 113 may be smaller than the width of the bottom surface of the first partition wall portion 113.

Since the sides of the partition wall 103 have an adverse slope, the display device 4 can facilitate the formation of first and second color conversion patterns 310 and 320. In a case where the first and second color conversion patterns 310 and 320 are formed by, for example, inkjet printing, the sides of the partition wall 103 with an adverse slope may help an ink composition for forming the first and second color conversion patterns 310 and 320 to be aligned.

Figure 12A:
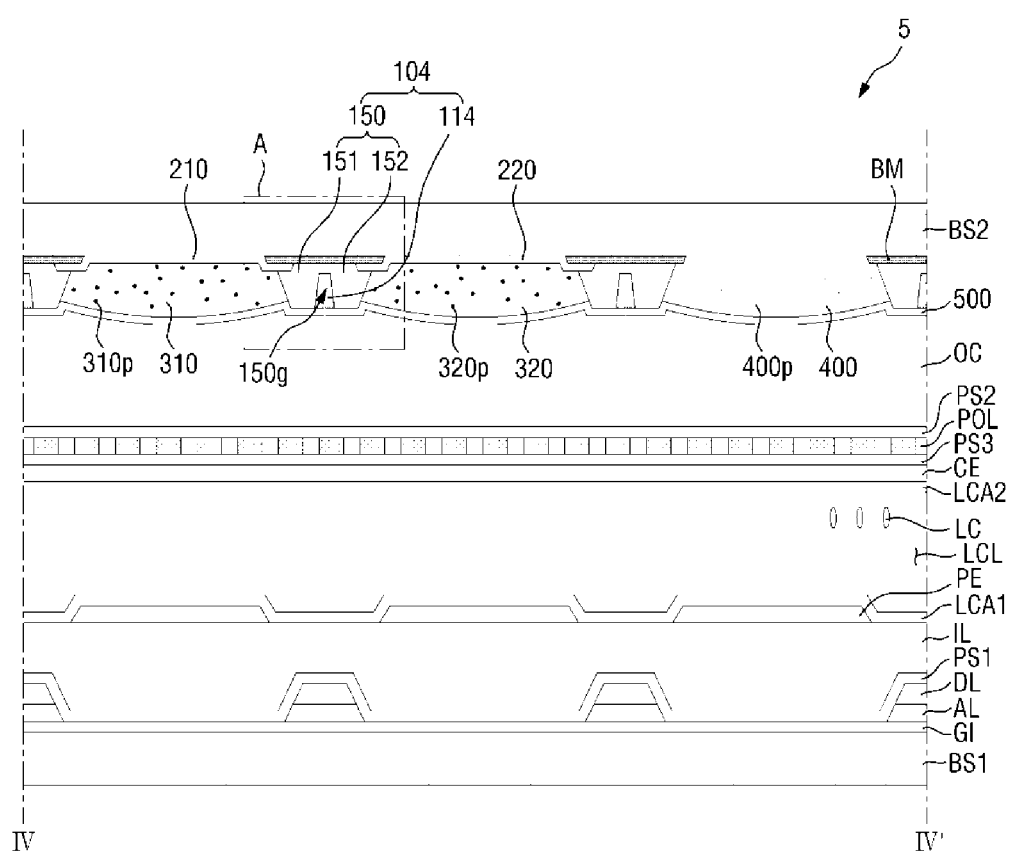
Figure 12B:
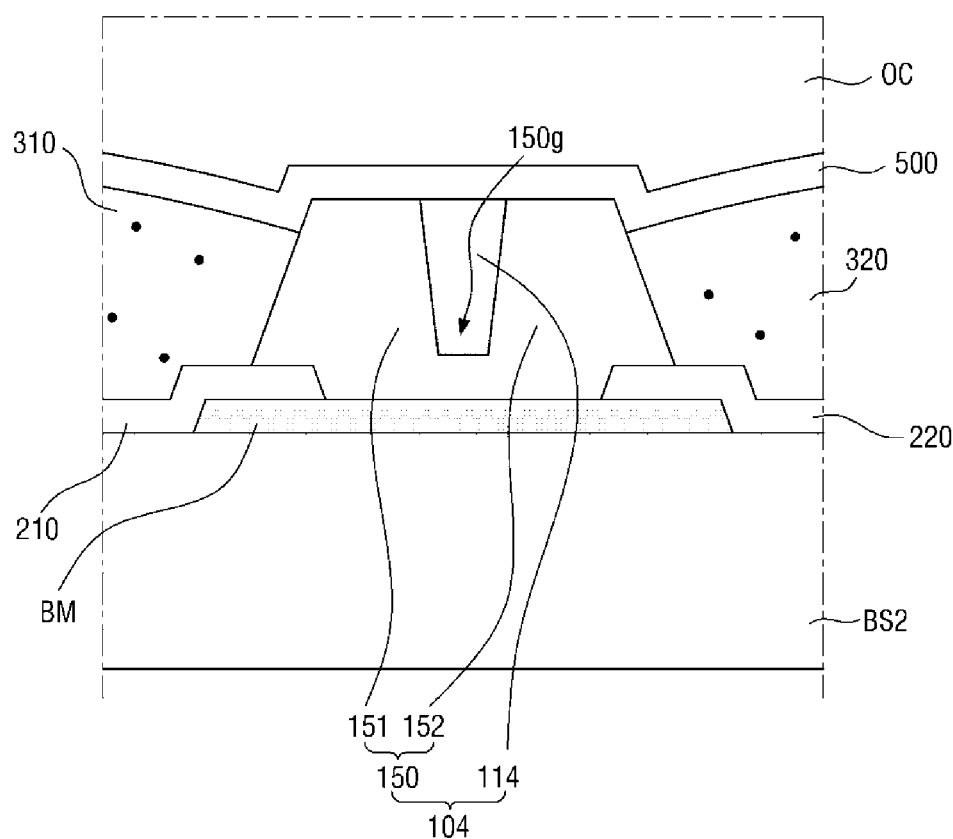

FIGS. 12A and 12B are cross-sectional views of a display device according to another exemplary embodiment of the inventive concepts. Specifically, FIG. 12A is a cross-sectional view corresponding to FIG. 4, and FIG. 12B is an enlarged cross-sectional view of an area A of FIG. 12A.

Referring to FIGS. 12A and 12B, a display device 5 differs from the display device 1 of FIG. 1 in that a light-transmitting structure 150 of a partition wall 104 include second partition wall portions 151 and third partition wall portions 152, which have inner sides facing the inner sides of the second partition wall portions 151 and are formed in one integral body with the second partition wall portions 151 without any physical boundary therebetween.

In an exemplary embodiment, the light-transmitting structure 150 of the partition wall 104 may include the second partition wall portions 151 and the third partition wall portions 152, the inner sides of the second partition wall portions 151 may face the inner sides of the third partition wall portions 152, and the spaces between the inner sides of the second partition wall portions 151 and the third partition wall portions 152 may define a groove 150g of the light-transmitting structure 150. The groove 150g may be formed in the shape of a trench.

Third partition wall portions 114 may be inserted in the groove 150g of the light-transmitting structure 150. Since the second partition wall portions 151 and the third partition wall portions 152 of the light-transmitting structure 150 are physically connected, the first partition wall portion 114 may be spaced apart from a light-shielding member BM in the third direction Z.

Figure 13A:
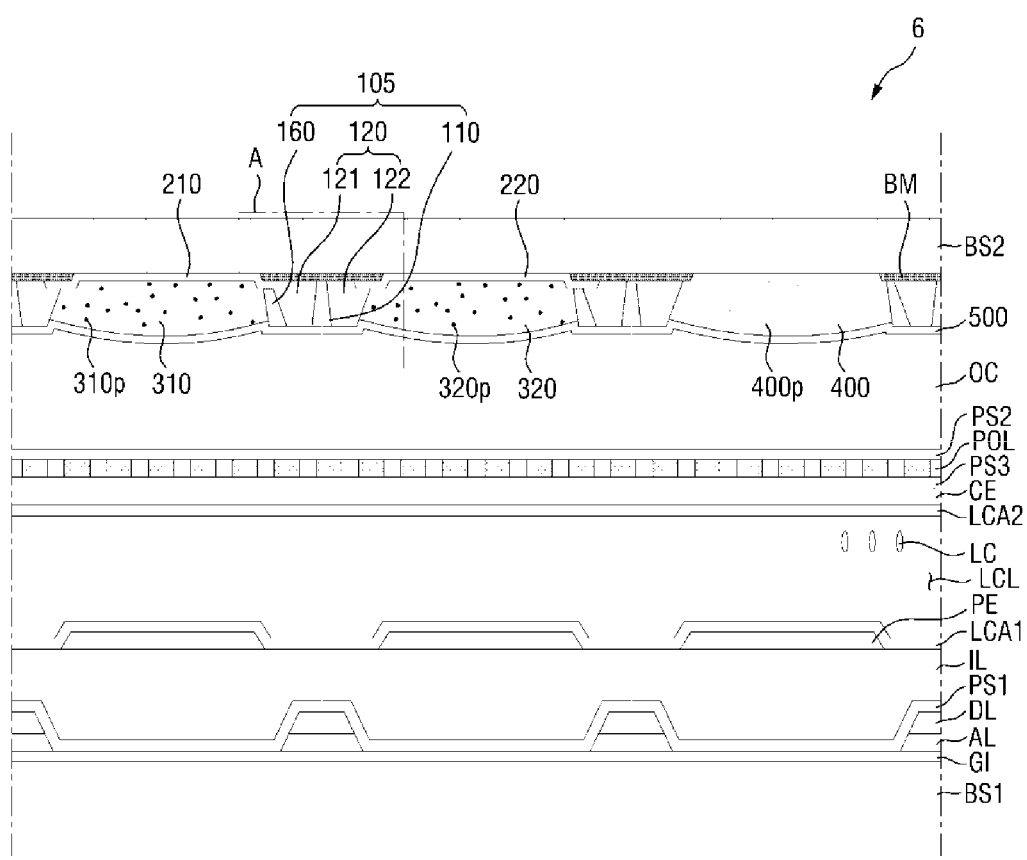
Figure 13B:
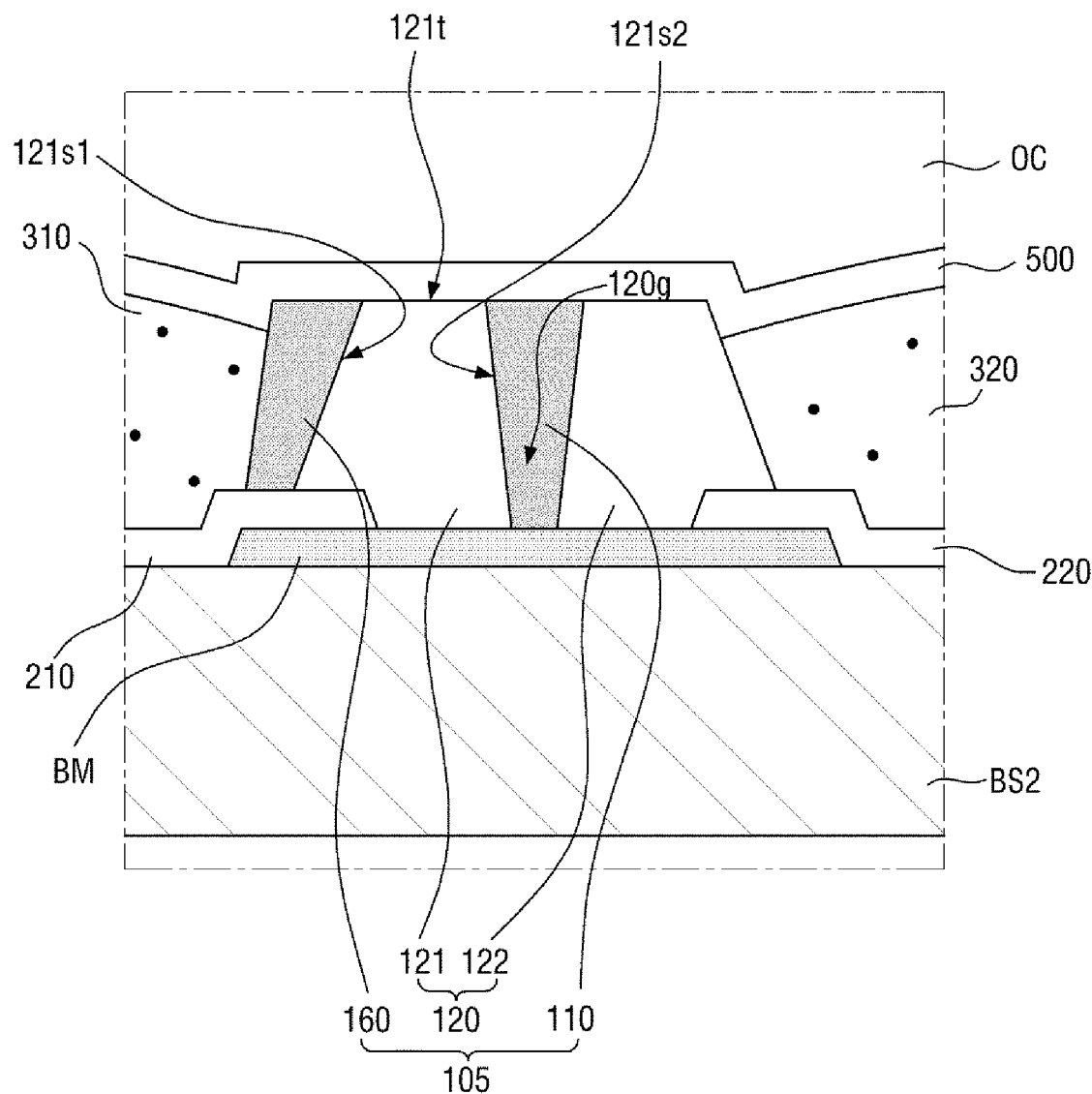

FIGS. 13A and 13B are cross-sectional views of a display device according to another exemplary embodiment of the inventive concepts. Specifically, FIG. 13A is a cross-sectional view corresponding to FIG. 4, and FIG. 13B is an enlarged cross-sectional view of an area A of FIG. 13A.

Referring to FIGS. 13A and 13B, a display device 6 differs from the display device 1 of FIG. 1 in that a partition wall 105 includes a light-transmitting structure 120 having a groove 120g and a first partition wall portion 110 and further includes fourth partition wall portions 160 in contact with the light-transmitting structure 120.

In an exemplary embodiment, the fourth partition wall portions 160 may be disposed on a first or second wavelength band filter 210 or 220. The fourth partition wall portions 160 may be in contact with outer sides 121s1 of second partition wall portions 121 of the light-transmitting structure 120.

The fourth partition wall portions 160 may be formed of a material having a higher optical density than the light-transmitting structure 120. In a non-limiting example, the fourth partition wall portions 160 may be formed of the same material as the first partition wall portion 110 and may include a negative photosensitive material, but the inventive concepts are not limited thereto.

For example, the optical density of the fourth partition wall portions 160 may be about 2.0/2 μm or higher, about 3.0/2 μm or higher, or about 4.0/2 μm or higher. That is, the optical density, in a widthwise direction, of the fourth partition wall portions 160 having a width of 2 μm may be about 2.0 or higher, about 3.0 or higher, or about 4.0 or higher. The fourth partition wall portions 160 may be formed of the same material as, or a different material from, a light-shielding member BM.

The fourth partition wall portions 160 may be disposed between first and second color conversion patterns 310 and 320, which are spaced apart from each other in a horizontal direction (for example, the first direction X), and between the second color conversion pattern 320 and a light-transmitting pattern 400, which are also spaced apart from each other in the horizontal direction (for example, the first direction X). The height of the fourth partition wall portions 160 may be substantially the same as the height of the partition wall 105.

Because the fourth partition wall portions 160 have a sufficient height, a phenomenon in which light of a first color emitted by a first wavelength shift material 310p contained in the first color conversion pattern 310 travels into the second color conversion pattern 320 to cause the first color to be displayed in a second pixel PXb, i.e., a light leakage defect, can be suppressed.

Figure 14A:
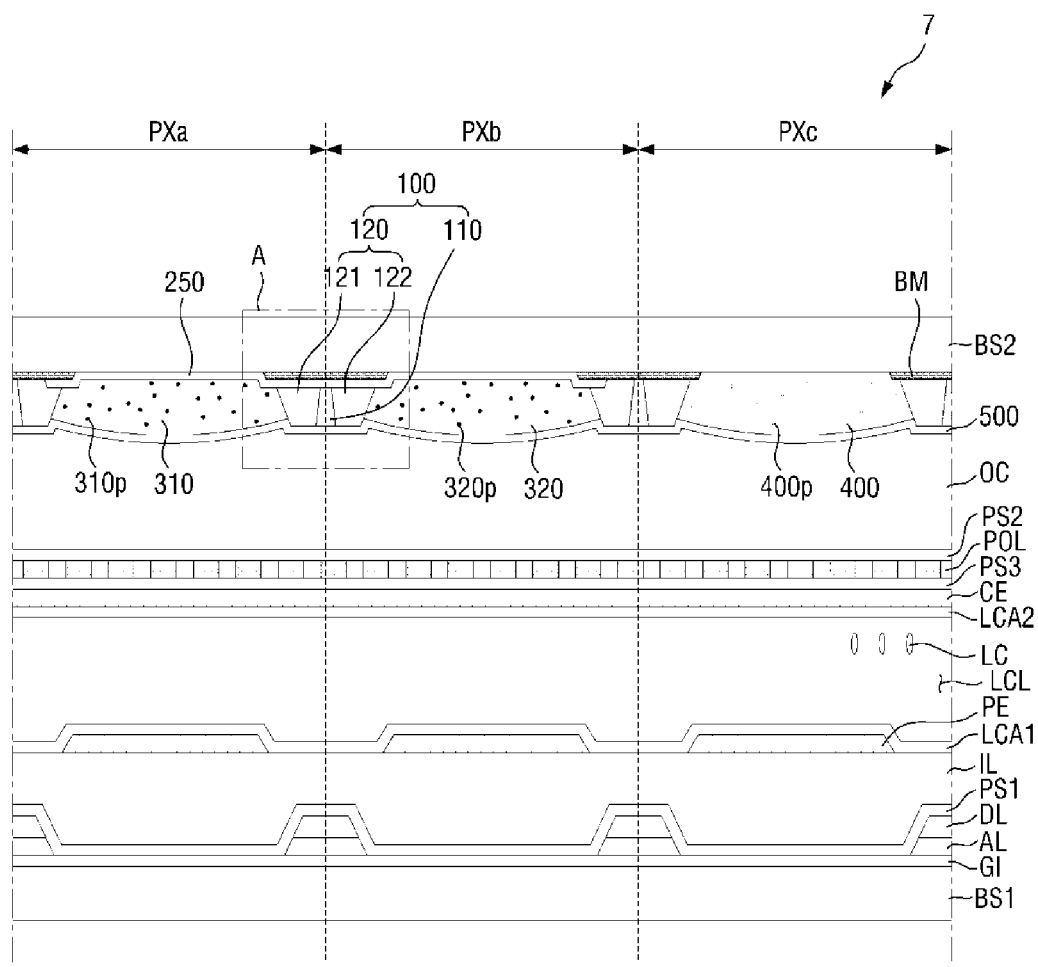
Figure 14B:
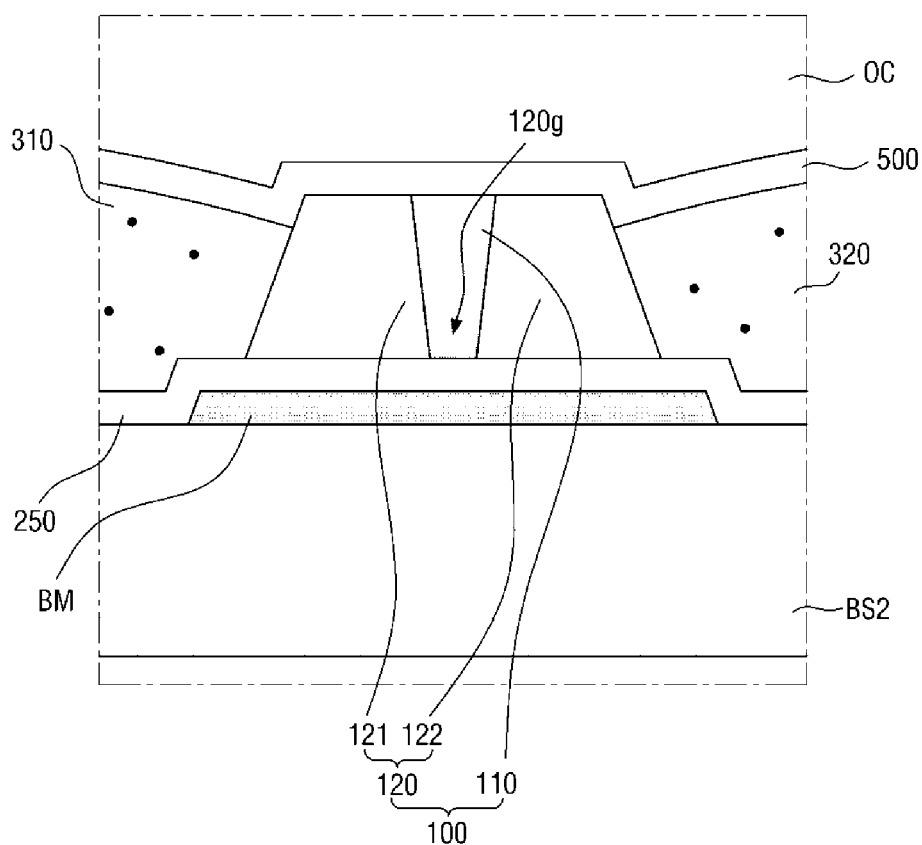

FIGS. 14A and 14B are cross-sectional views of a display device according to another exemplary embodiment of the inventive concepts. Specifically, FIG. 14A is a cross-sectional view corresponding to FIG. 4, and FIG. 14B is an enlarged cross-sectional view of an area A of FIG. 14A.

Referring to FIGS. 14A and 14B, a display device 7 differs from the display device 1 of FIG. 1 in that a first wavelength band filter 250 is formed in one integral body over first and second pixels PXa and PXb.

In an exemplary embodiment, the first wavelength band filter 250 may be disposed on a light-shielding member BM to completely cover the top surface of part of the light-shielding member BM at the boundary between first and second pixels PXa and PXb.

The first wavelength band filter 250 is a wavelength-selective optical filter that selectively transmits only some of the wavelength band of incident light therethrough by transmitting light of a particular wavelength band therethrough, while blocking the transmission of light of another particular wavelength band. The first wavelength band filter 250 may be disposed in the first and second pixels PXa and PXb.

In an exemplary embodiment, the first wavelength band filter 250 may selectively transmit light having a longer peak wavelength than the peak wavelength of a third color provided by a light source unit (not illustrated) and may absorb or reflect light of the third color.

For example, the first wavelength band filter 250 may be disposed in the first and second pixels PXa and PXb and may transmit light of a wavelength band including the peak wavelength of a first color and light of a wavelength band including the peak wavelength of a second color, while absorbing light of a wavelength band including the peak wavelength of the third color.

In an exemplary embodiment, the first wavelength band filter 250 may be in contact with a light-transmitting structure 120, a first partition wall portion 110, and the light-shielding member BM at the same time.

Figure 15:
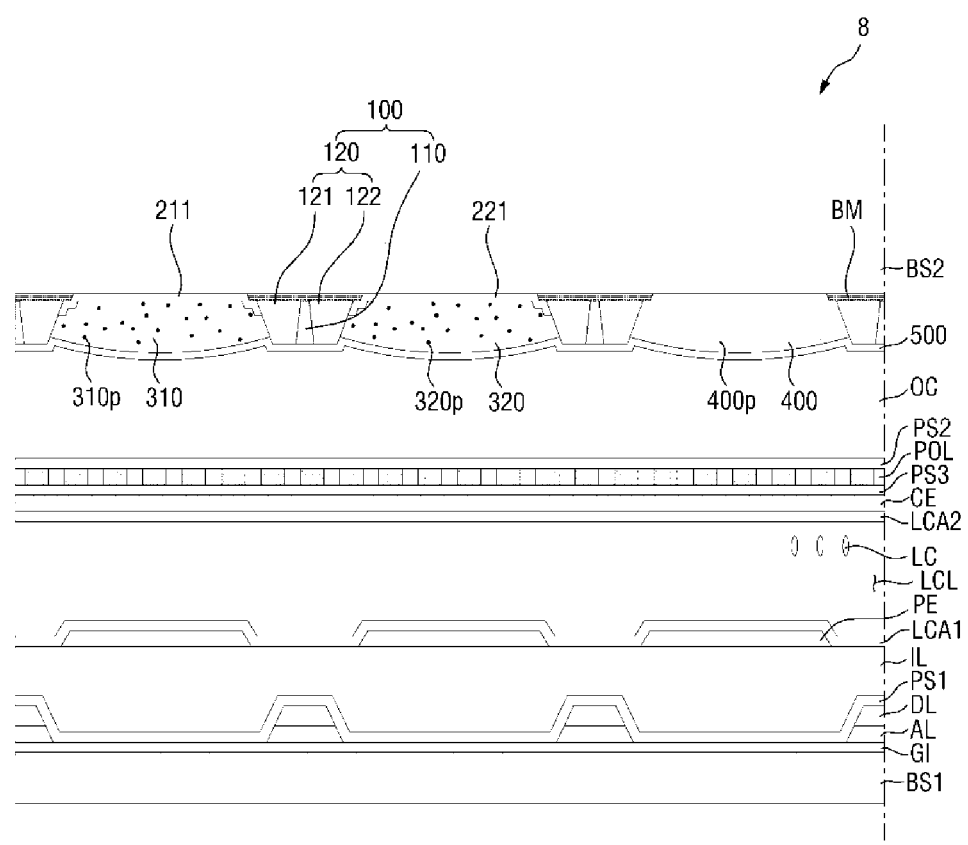

FIG. 15 is a cross-sectional view of a display device according to another exemplary embodiment of the inventive concepts. Specifically, FIG. 15 is a cross-sectional view corresponding to FIG. 4.

Referring to FIG. 15, a display device 8 differs from the display device 1 of FIG. 1 in that first and second wavelength band filters 211 and 221 are disposed on a partition wall 100.

In an exemplary embodiment, the first wavelength band filter 211 may at least partially overlap with the partition wall 100 and may be disposed on the partition wall 100. The first wavelength band filter 211 may be disposed in a first pixel and may transmit light of a wavelength band including the peak wavelength of a first color therethrough, while absorbing light of a wavelength band including the peak wavelength of a third color.

Specifically, the first wavelength band filter 211 may be disposed on sides of the partition wall 100. For example, the first wavelength band filter 211 may be disposed directly on sides of the partition wall 100. The first wavelength band filter 211 may be in contact with a light-shielding member BM.

Similarly, the second wavelength band filter 221 may at least partially overlap with the partition wall 100 and may be disposed on the partition wall 100. The second wavelength band filter 221 may be disposed in a second pixel and may transmit light of a wavelength band including the peak wavelength of a second color therethrough, while absorbing light of a wavelength band including the peak wavelength of the third color.

Specifically, the second wavelength band filter 221 may be disposed on sides of the partition wall 100. For example, the second wavelength band filter 221 may be disposed directly on sides of the partition wall 100. The second wavelength band filter 221 may be in contact with the light-shielding member BM.

A method of manufacturing a display device according to some exemplary embodiments of the inventive concepts will hereinafter be described.

The method of manufacturing a display device according to some exemplary embodiments of the inventive concepts may include: forming a light-transmitting structure having a groove on a substrate so as to define a plurality of openings; forming a light-shielding partition wall portion in the groove, the light-shielding partition wall portion having a higher optical density than the light-transmitting structure; ejecting an ink composition including a wavelength shift material into the openings defined by the light-transmitting structure; and curing the ink composition. Each step of the method of manufacturing a display device according to some exemplary embodiments of the inventive concepts will hereinafter be described.

FIGS. 16A through 16K are cross-sectional views illustrating a method of manufacturing a display device according to an exemplary embodiment of the inventive concepts.

Figure 16A:
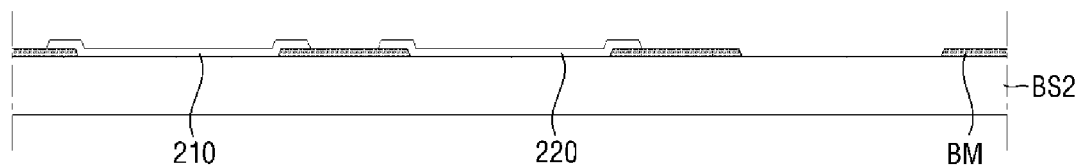
FIG. 16A, FIG. 16B, FIG. 16C, FIG. 16D, FIG. 16E, FIG. 16F, FIG. 16G, FIG. 16H, FIG. 16I, FIG. 16J, and FIG. 16K are cross-sectional views illustrating a method of manufacturing a display device according to an exemplary embodiment of the inventive concepts.

Referring to FIG. 16A, a light-shielding member BM, a first wavelength band filter 210, and a second wavelength band filter 220 are formed on one surface (i.e., the top surface in FIG. 16A) of a substrate BS2. The light-shielding member BM and the first and second wavelength band filters 210 and 220 have been already described above with reference to FIGS. 1 through 8, and thus, detailed descriptions thereof will be omitted.

Figure 16B:
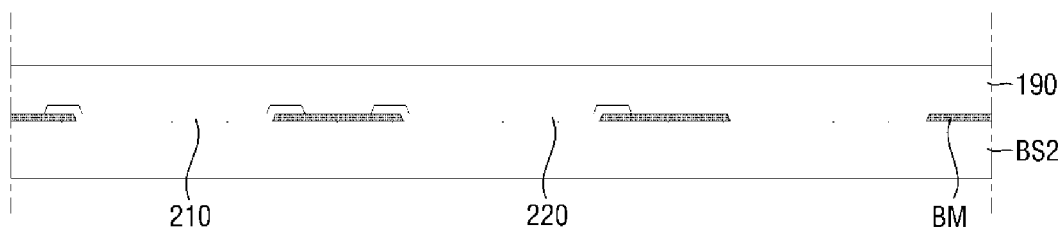

Thereafter, referring to FIG. 16B, an organic layer 190 is formed on the first and second wavelength band filters 210 and 220. The formation of the organic layer 190 may include applying a composition (not illustrated) for forming the organic layer 190 and prebaking the composition forming the organic layer 190. In an exemplary embodiment, the composition for forming the organic layer 190 and the organic layer 190 may include a negative photosensitive material.

The organic layer 190 may have light-transmitting characteristics. The light transmittance of the organic layer 190 may be about 90% or higher, about 95% or higher, about 98% or higher, or about 99% or higher. The material of the organic layer 190 is not particularly limited as long as a material having an excellent light transmittance is used. For example, the material of the organic layer 190 may be an organic material such as an epoxy resin, an acrylic resin, or an imide resin.

Figure 16C:
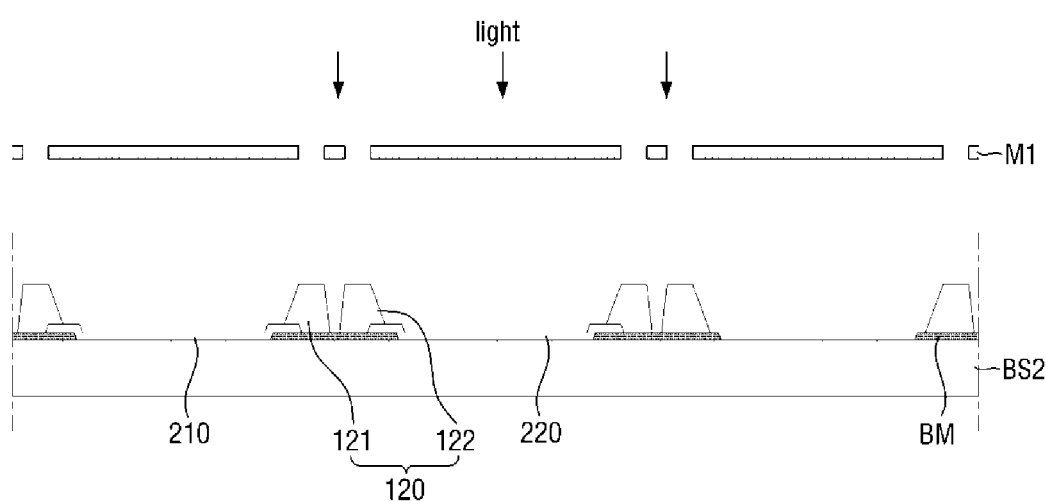

Thereafter, referring to FIG. 16C, a light-transmitting structure 120 is formed on the substrate BS2. The light-transmitting structure 120 may include light-transmitting partition wall patterns. The light-transmitting structure 120 may include second partition wall portions 121 and third partition wall portions 122, which have inner sides facing the inner sides of the second partition wall portions 121.

The formation of the light-transmitting structure 120 may include applying light to the organic layer 190 using a mask M1 as an exposure mask and forming the light-transmitting structure 120 by applying a developer. In an exemplary embodiment where the composition for forming the organic layer 190 and the organic layer 190 includes a negative photosensitive material, part of the organic layer 190 to which light is applied through openings of the mask M1 may be cured, and the rest of the organic layer 190 may be removed by the developer. As a result, the light-transmitting structure 120, including the second partition wall portions 121 and the third partition wall portions 122, may be simultaneously formed by a single process.

FIG. 16C illustrates the second partition wall portions 121 and the third partition wall portions 122 of the light-transmitting structure 120 as being completely spaced apart from each other to have spaces therebetween, but alternatively, the second partition wall portions 121 and the third partition wall portions 122 may be formed in one integral body with each other without any physical boundaries therebetween and may be partially separated from each other to have spaces therebetween.

The light-transmitting structure 120 may help an ink composition to be aligned during an ink ejection process that will be described later. That is, the light-transmitting structure 120 may serve as a guide for accurately discharging and stably positioning the ink composition at each desired position. The height of the light-transmitting structure 120 may have a lower limit of about 7.0 µm, about 7.5 µm, about 8.0 µm, about 8.5 µm, about 9.0 µm, about 9.5 µm, about 10.0 µm, about 10.5 µm, about 11.0 µm, about 11.5 µm, about 12.0 µm, or about 15.0 µm.

The second partition wall portions 121 and the third partition wall portions 122 of the light-transmitting structure 120 have been already described above with reference to FIGS. 1 through 8, and thus, detailed descriptions thereof will be omitted.

Figure 16D:
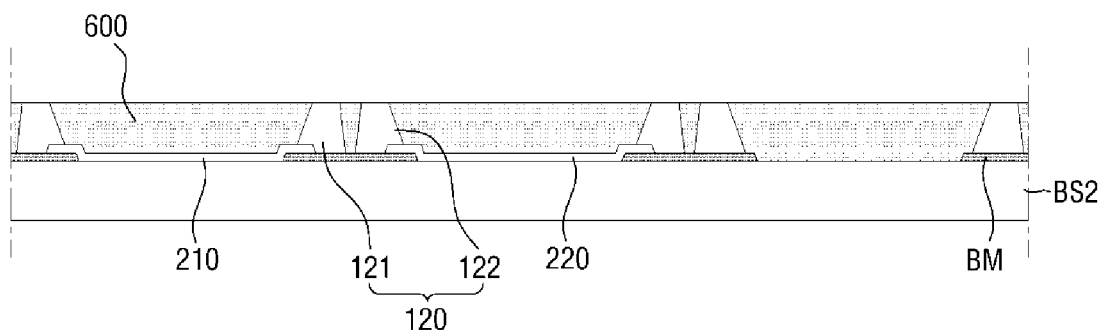

Thereafter, referring to FIG. 16D, a light-shielding composition 600 is applied on the light-transmitting structure 120. In some exemplary embodiments, the light-shielding composition 600 may be pre-baked. The pre-baking of the light-shielding composition 600 may be performed at a temperature of about 50° C. to 120° C. for about 60 seconds to 200 seconds. The light-shielding composition 600 may include a negative photosensitive material.

In an exemplary embodiment, the application of the light-shielding composition 600 may be a step of at least partially filling the groove 120g of the light-transmitting structure 120 with the light-shielding composition 600. For example, the light-shielding composition 600 may be applied on the substantially entire surface of the substrate BS2 so as to fill the groove 120g.

In some exemplary embodiments, the application of the light-shielding composition 600 may be a step of applying the light-shielding composition 600 to substantially the same thickness as the height of the light-transmitting structure 120.

Figure 16E:
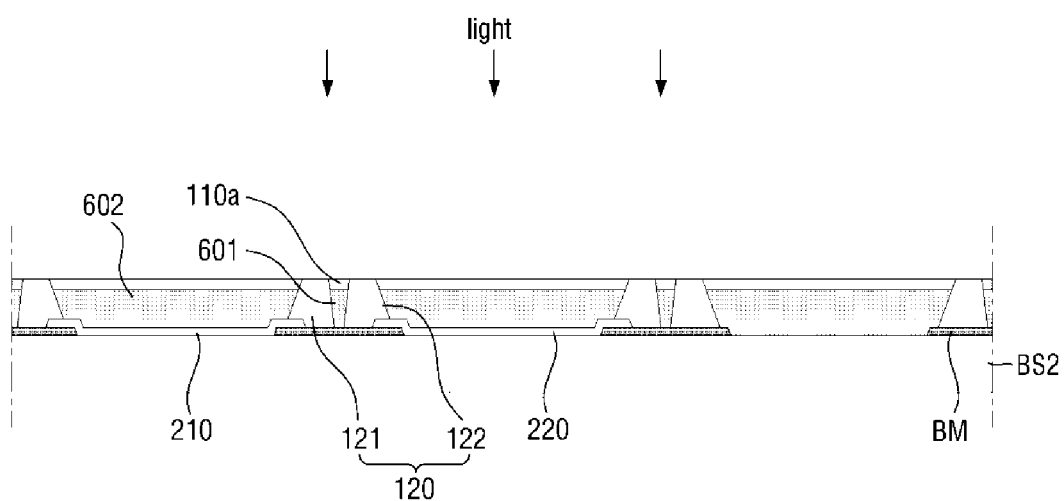

Thereafter, referring to FIG. 16E, the light-shielding composition 600 is partially cured by applying light from a side of the surface (i.e., the top surface in FIG. 16E) of the substrate BS2. The light applied from the side of the surface of the substrate BS2 may contribute to the curing of the light-shielding composition 600 and may thus form a partially cured layer 110a. For example, light traveling toward the light-shielding composition 600 cures the surface of the light-shielding composition 600, further travels by a predetermined distance, and then gradually disappears due to the absorbance characteristics of the light-shielding composition 600. Accordingly, the partially cured layer 110a may be formed at or near the surface of a light-shielding composition 602, and part of the light-shielding composition 602 relatively distant from the surface of the light-shielding composition 602 may remain uncured. Not only the partially cured layer 110a, but also a light-shielding composition 601 may be inserted in the groove 120g of the light-transmitting structure 120.

In some exemplary embodiments, the rigidity and the thickness of the partially cured layer 110a may be controlled by controlling the intensity of light applied to the light-shielding composition 600 and the duration of application of light to the light-shielding composition 600 so as to control the depth of exposure.

Figure 16F:
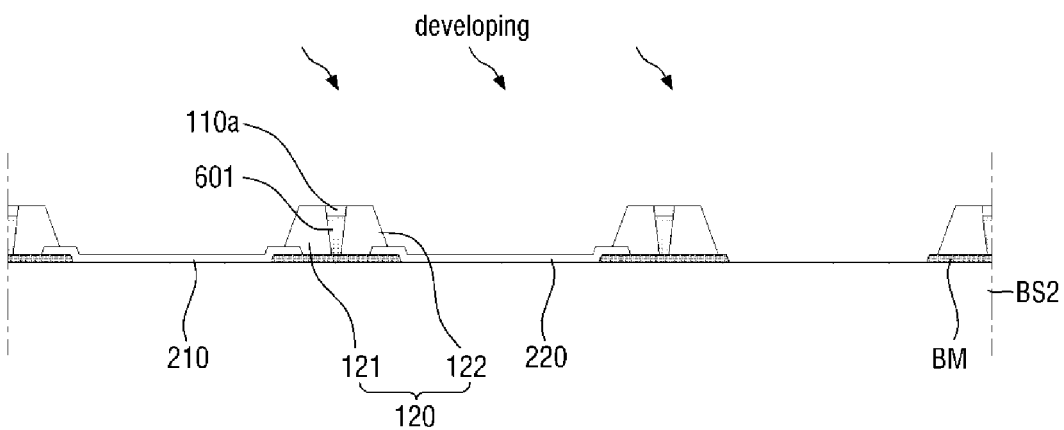

Thereafter, referring to FIG. 16F, the light-shielding composition 602 that remains uncured and the partially cured layer 110a are removed from between adjacent portions of the light-transmitting structure 120. The removal of the light-shielding composition 602 and the partially cured layer 110a may be a step of removing the light-shielding composition 602 and the partially cured layer 110a by applying a developer. The light-shielding composition 601 that fills the groove 120g may remain unremoved by the developer due to the presence of the partially cured layer 110a thereon.

As a result, the substrate BS2, the light-transmitting structure 120 disposed on the substrate BS2, and a light-shielding layer (601 and 110a) that fills the groove 120 of the light-transmitting structure 120 may be obtained.

Figure 16G:
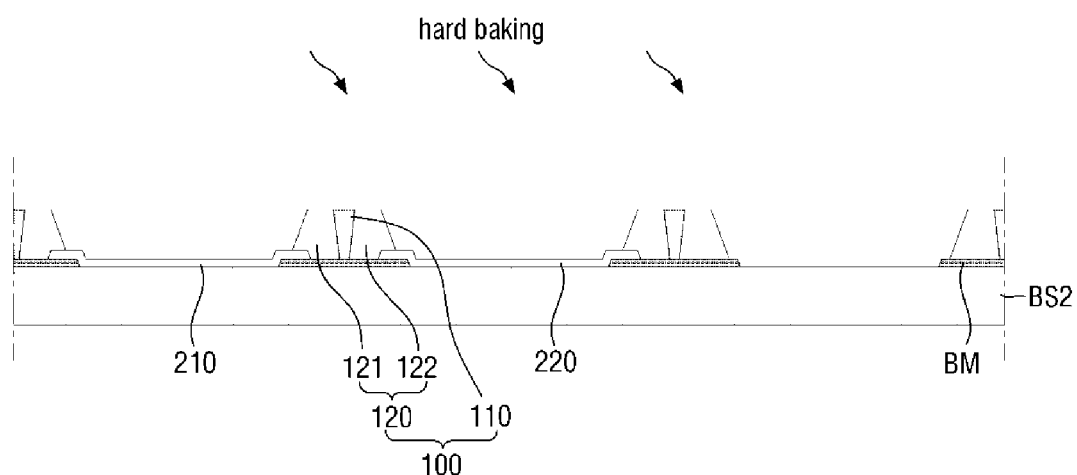

Thereafter, referring to FIG. 16G, a first partition wall portion 110 is formed by hard-baking the light-shielding composition 601. The hard-baking of the light-shielding composition 601 may be performed at a temperature of about 180° C. to 250° C. for about 20 minutes to 1 hour. The light-shielding layer (601 and 110a) that fills the groove 120 of the light-transmitting structure 120 may be completely cured by high-temperature thermal treatment performed during the hard-baking of the light-shielding composition 601. In this manner, the first partition wall portion 110 may be formed on the substrate BS2. The first partition wall portion 110 has been already described above with reference to FIGS. 1 through 8, and thus, a detailed description thereof will be omitted.

Figure 16H:
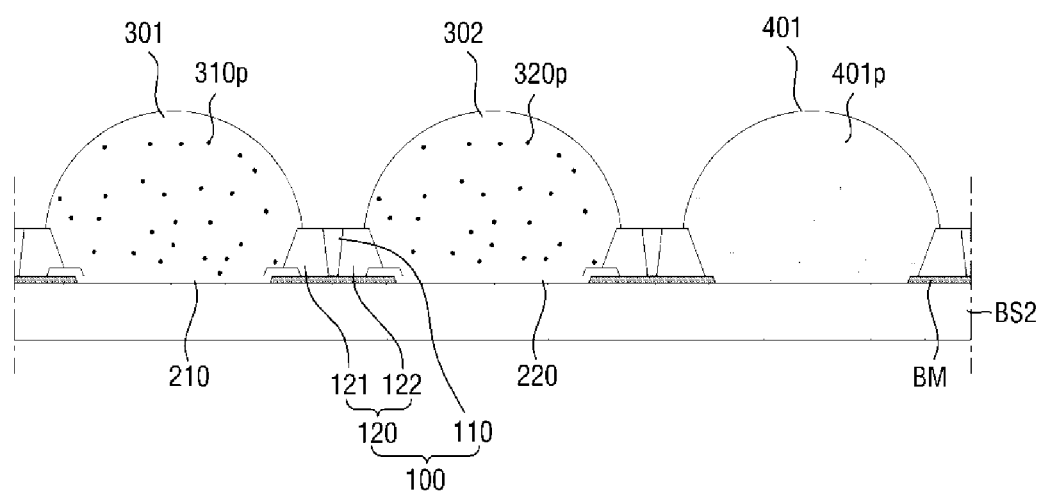

Thereafter, referring to FIG. 16H, first, second, and third ink compositions 301, 302, and 401 are ejected into openings formed in the light-transmitting structure 120. The first, second, and third ink compositions 301, 302, and 401 may be sequentially ejected or may be ejected at the same time. In an exemplary embodiment, the first ink composition 301 may include a first wavelength shift material 310p that emits light having a peak wavelength of a first color, the second ink composition 303 may include a second wavelength shift material 320p that emits light having a peak wavelength of a second color, and the third ink composition 401 may include a particle material 401p.

Since the light-transmitting structure 120 has a sufficient height, the first, second, and third ink compositions 301, 302, and 401 can be ejected precisely at desired locations.

Figure 16I:
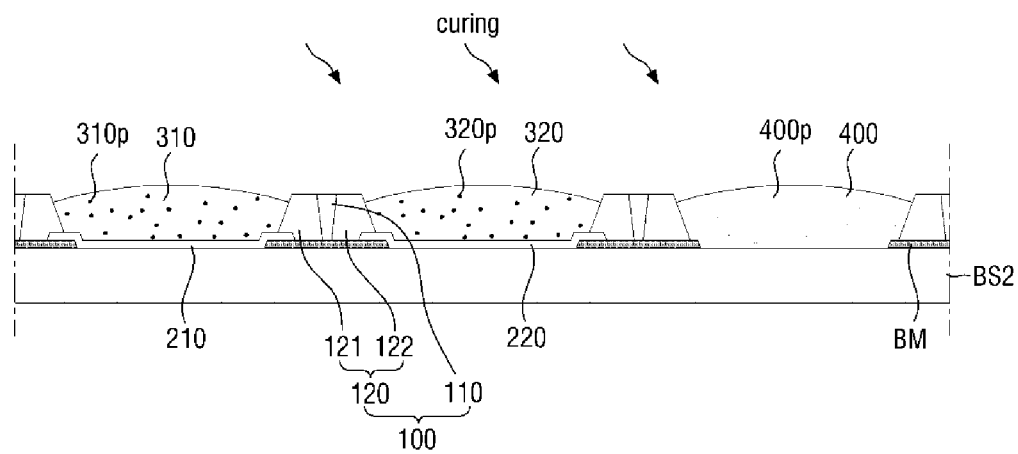

Thereafter, referring to FIG. 16I, a first color conversion pattern 310, a second color conversion pattern 320, and a light-transmitting pattern 400 are formed by drying and curing the first, second, and third ink compositions 301, 302, and 401. The first color conversion pattern 310, the second color conversion pattern 320, and the light-transmitting pattern 400 have been already described above with reference to FIGS. 1 through 8, and thus, detailed descriptions thereof will be omitted.

FIGS. 16H and 16G illustrate an example in which the first, second, and third ink compositions 301, 302, and 401 are all cured at once after the ejection of the first, second, and third ink compositions 301, 302, and 401. However, alternatively, the second ink composition 302 may be ejected after the formation of the first color conversion pattern 310, and the third ink composition 401 may be ejected and cured after the formation of the second color conversion pattern 320, thereby forming the light-transmitting pattern 400.

Figure 16J:
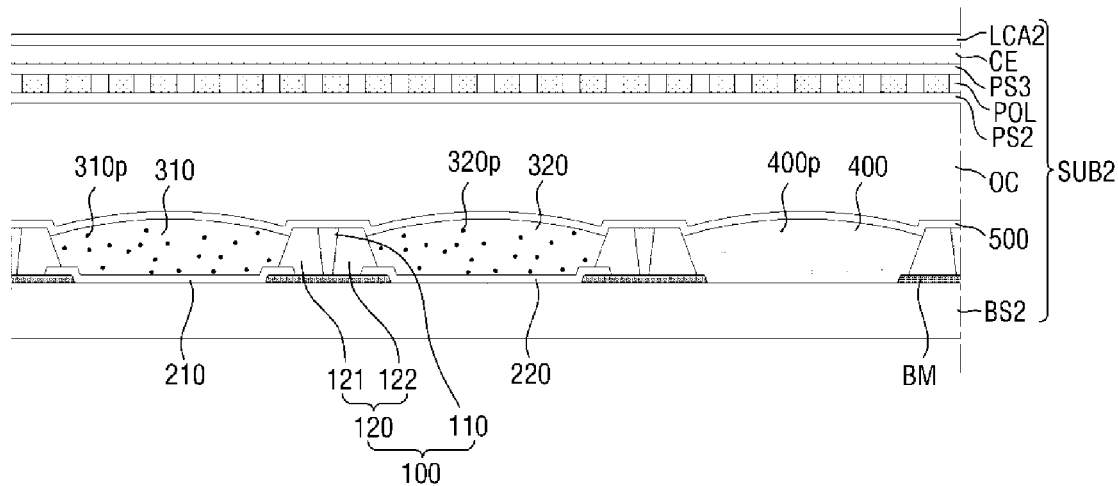

Thereafter, referring to FIG. 16J, a fourth wavelength band filter 500, an overcoat layer OC, a polarizing layer POL, and a common electrode CE are sequentially formed on the first color conversion pattern 310, the second color conversion pattern 320, and the light-transmitting pattern 400, thereby obtaining a second display substrate SUB2. The elements of the second display substrate SUB2 have been already described above with reference to FIGS. 1 through 8, and thus, detailed descriptions thereof will be omitted.

Figure 16K:
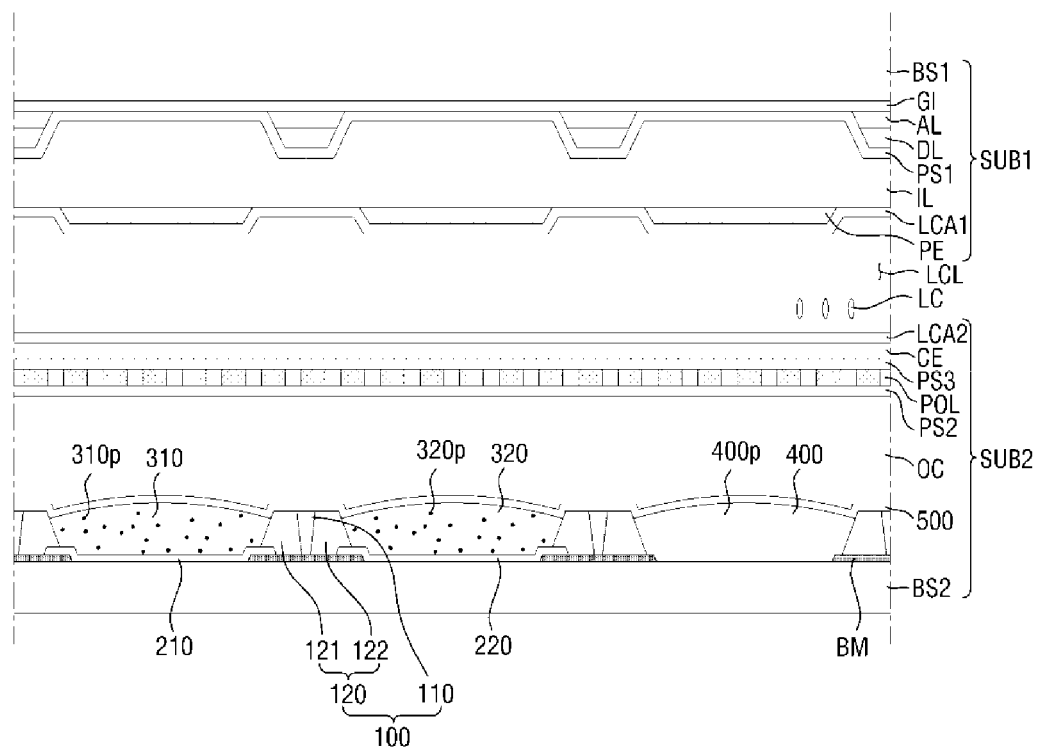

Thereafter, referring to FIG. 16K, a first display substrate SUB1 including switching elements Q and pixel electrodes PE is prepared, and a liquid crystal layer LCL is interposed between the first and second display substrates SUB1 and SUB2, thereby obtaining a display panel. The first and second display substrates SUB1 and SUB2 may be bonded together by a sealing member (not illustrated).

The liquid crystal layer LCL may be interposed between the first and second display substrates SUB1 and SUB2 by, for example, dropping a liquid crystal composition comprising liquid crystal molecules LC on the first or second display substrate SUB1 or SUB2 and bonding the first and second display substrates SUB1 and SUB2 together. Although not specifically illustrated, a light source unit (not illustrated) may be further disposed on the first display substrate SUB1.

Methods of manufacturing a display device according to other exemplary embodiments of the inventive concepts will hereinafter be described.

FIG. 17A through 17E are cross-sectional views illustrating a method of manufacturing a display device according to another exemplary embodiment of the inventive concepts.

Figure 17A:
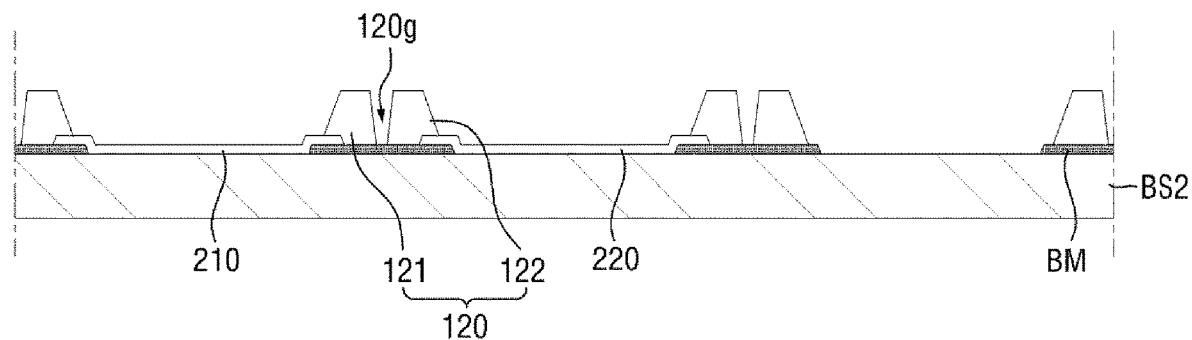
FIG. 17A, FIG. 17B, FIG. 17C, FIG. 17D, and FIG. 17E are cross-sectional views illustrating a method of manufacturing a display device according to another exemplary embodiment of the inventive concepts.

Referring to FIG. 17A, a light-shielding member BM, a first wavelength band filter 210, a second wavelength band filter 220, and a light-transmitting structure 120 having a groove 120g are formed on a substrate BS2. The formation of the light-transmitting structure 120 has been already described above with reference to FIGS. 16A through 16C, and thus, a detailed description thereof will be omitted.

Figure 17B:
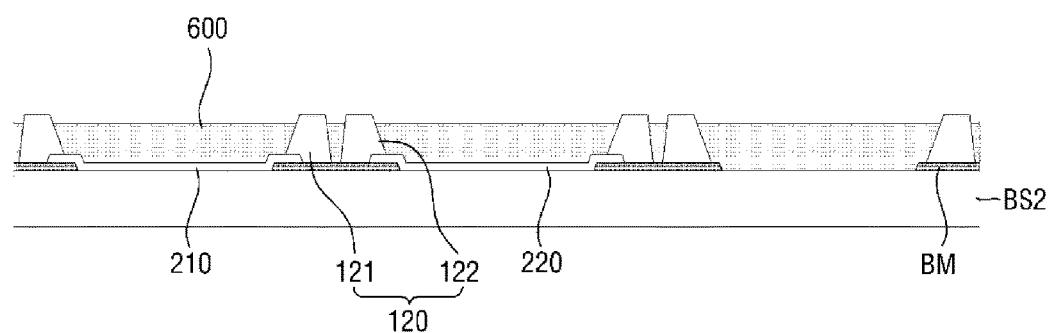

Referring to FIG. 17B, a light-shielding composition 600 is applied on the light-transmitting structure 120. In some exemplary embodiments, the light-shielding composition 600 may be pre-baked.

In an exemplary embodiment, the application of the light-shielding composition 600 may be a step of at least partially filling the groove 120g with the light-shielding composition 600, but only to a thickness less than the height of the light-transmitting structure 120. That is, the top and the sides of the light-transmitting structure 120 may not be covered, at least partially, by the light-shielding composition 600 and may thereby be exposed.

Figure 17C:
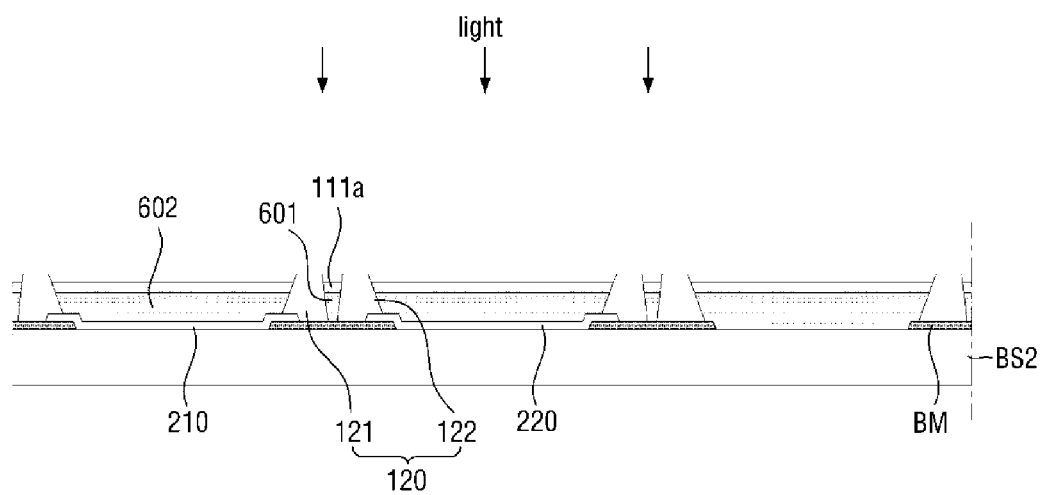

Thereafter, referring to FIG. 17C, the light-shielding composition 600 is partially cured by applying light from a side of a surface of the substrate BS2. The light applied from the side of the surface of the substrate BS2 may contribute to the curing of the light-shielding composition 600 and may thus form a partially cured layer 111a. Not only the partially cured layer 110a, but also a light-shielding composition 601 may be inserted in the groove 120g of the light-transmitting structure 120.

In an exemplary embodiment, the surface of the partially cured layer 111a may be disposed below the top surface of the light-transmitting structure 120 with respect to the surface of the substrate BS2.

Figure 17D:
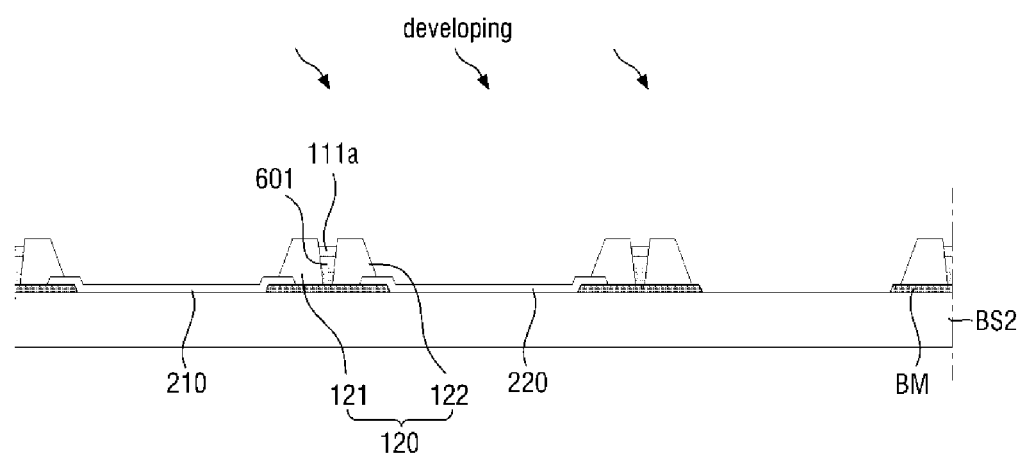

Thereafter, referring to FIG. 17D, a light-shielding composition 602 that remains uncured and the partially cured layer 111a are removed from between adjacent portions of the light-transmitting structure 120. The removal of the light-shielding composition 602 and the partially cured layer 111a may be a step of removing the light-shielding composition 602 and the partially cured layer 111a by applying a developer.

Figure 17E:
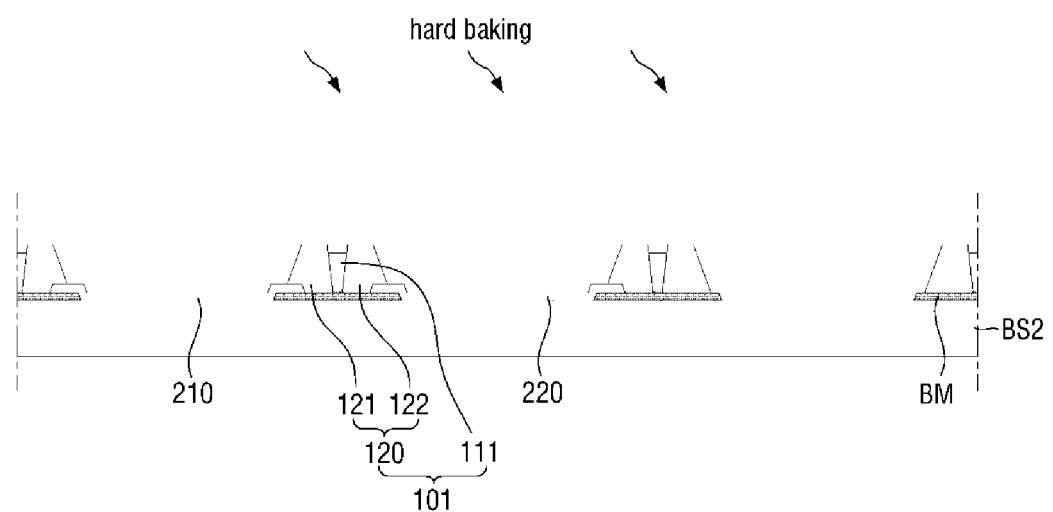

Thereafter, referring to FIG. 17E, a first partition wall portion 111 is formed by hard-baking the light-shielding composition 601. The light-shielding layer (601 and 111a) that fills the groove 120g of the light-transmitting structure 120 may be completely cured by high-temperature thermal treatment performed during the hard-baking of the light-shielding composition 601.

In an exemplary embodiment, the height of the first partition wall portion 111 may be smaller than the height of the light-transmitting structure 120. Accordingly, the inner sides of the second partition wall portions 121 and the inner sides of the third partition wall portions 122 may be exposed.

Although not specifically illustrated, the fabrication of a display device may be completed in the same manner as that described above with reference to FIGS. 16H through 16K.

FIG. 18A through 18G are cross-sectional views illustrating a method of manufacturing a display device according to another exemplary embodiment of the inventive concepts.

Figure 18A:
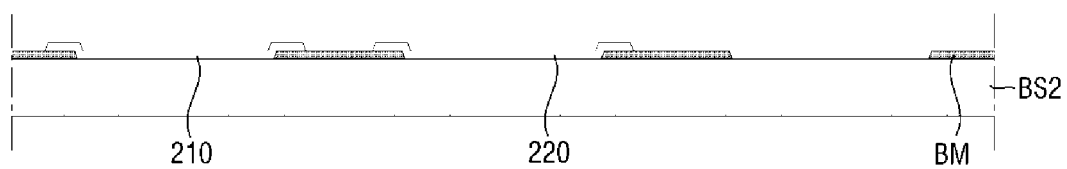
FIG. 18A, FIG. 18B, FIG. 18C, FIG. 18D, FIG. 18E, FIG. 18F, and FIG. 18G are cross-sectional views illustrating a method of manufacturing a display device according to another exemplary embodiment of the inventive concepts.

Referring to FIG. 18A, a light-shielding member BM, a first wavelength band filter 210, and a second wavelength band filter 220 are formed on a substrate BS2.

Figure 18B:
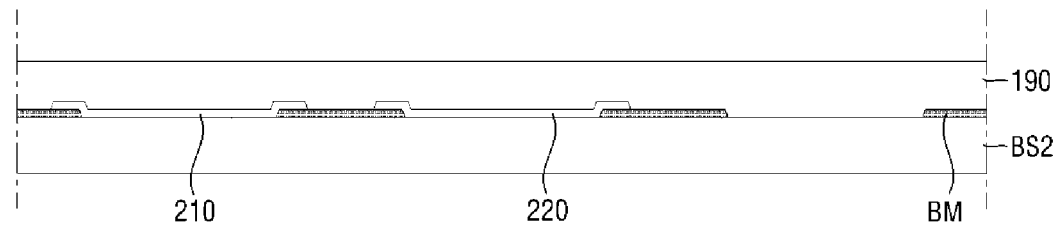

Thereafter, referring to FIG. 18B, an organic layer 190 is formed on the first and second wavelength band filters 210 and 220. In an exemplary embodiment, the organic layer 190 may include a negative photosensitive material. The formation of the organic layer 190 has been already described above with reference to FIG. 16B, and thus, a detailed description thereof will be omitted.

Figure 18C:
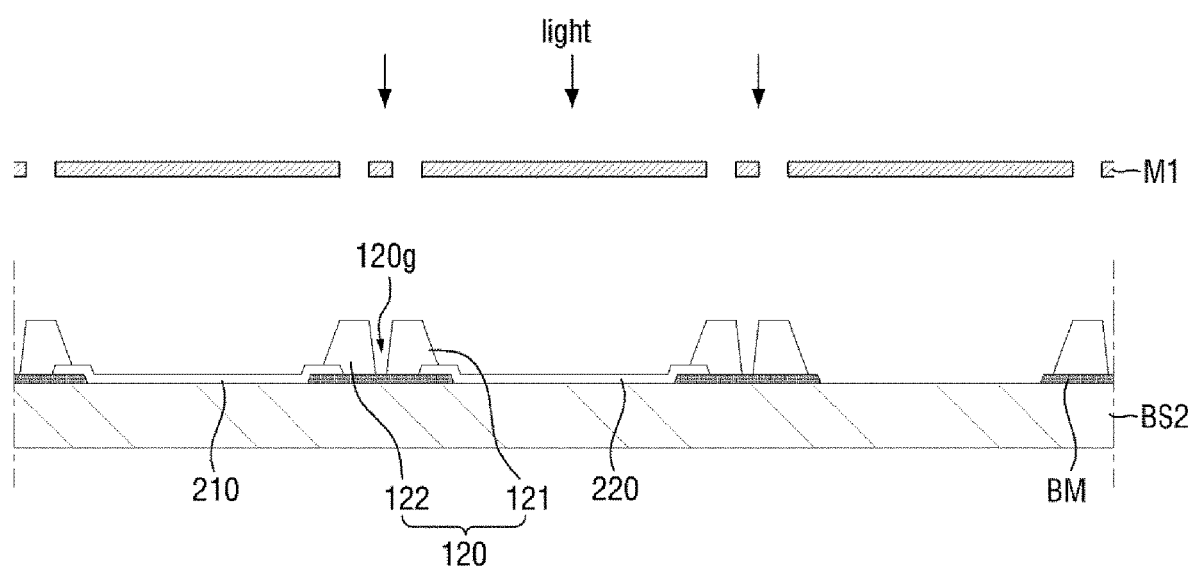

Thereafter, referring to FIG. 18C, a light-transmitting structure 120 having a groove 120g is formed on the substrate BS2. The formation of the light-transmitting structure 120 may include applying light to the organic layer 190 using a mask M1 as an exposure mask and forming the light-transmitting structure 120 by applying a developer. The formation of the light-transmitting structure 120 has been already described above with reference to FIG. 16C, and thus, a detailed description thereof will be omitted.

Figure 18D:
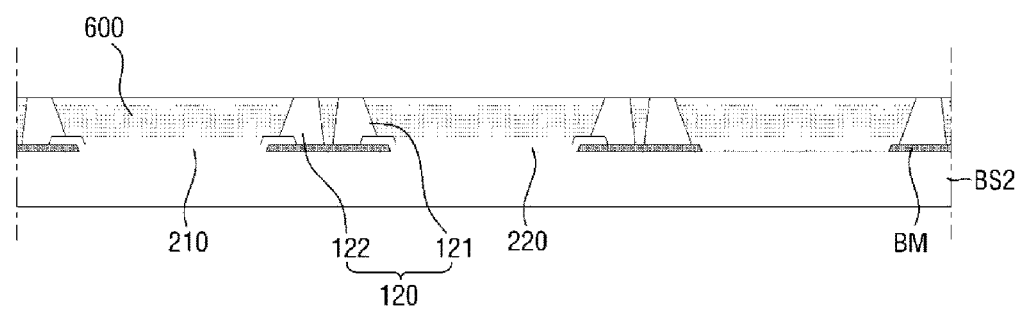

Thereafter, referring to FIG. 18D, a light-transmitting composition 600 is applied on the light-transmitting structure 120. The application of the light-shielding composition 600 has been already described above with reference to FIG. 16D, and thus, a detailed description thereof will be omitted.

Figure 18E:
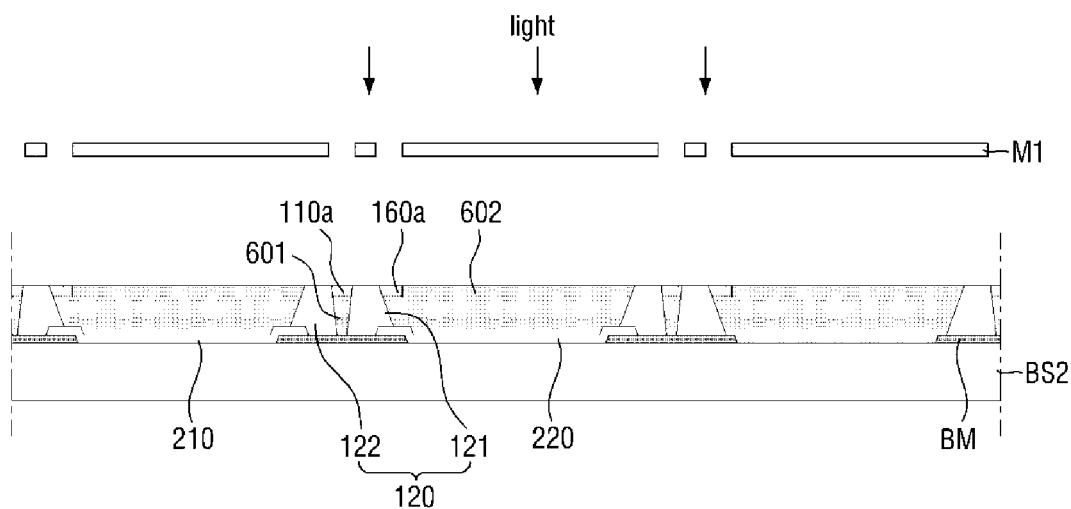

Thereafter, referring to FIG. 18E, first and second partially cured layers 110a and 160a are formed by applying light from a side of a surface of the substrate BS2 so as to partially cure the surface of the light-shielding composition 600.

In an exemplary embodiment, the formation of the first and second partially cured layers 110a and 160a may include placing a mask M1 and applying light to the light-shielding composition 600 using the mask M1 as an exposure mask.

The mask M1 used to form the first and second partially cured layers 110a and 160a may be the same as the mask M1 used to form the light-transmitting structure 120, in which case, the mask M1 may be shifted so that openings of the mask M1 can at least partially overlap with the groove 120g of the light-transmitting structure 120.

In the exemplary embodiment where the light-shielding composition 600 includes a negative photosensitive material, part of the light-shielding composition 600 to which light is applied through the openings of the mask M1 may be cured. For example, light traveling toward the light-shielding composition 600 cures the surface of the light-shielding composition 600, further travels by a predetermined distance, and then gradually disappears due to the absorbance characteristics of the light-shielding composition 600. Accordingly, the first and second partially cured layers 110a and 160a may be formed at or near the surface of the light-shielding composition 600, and part of the light-shielding composition 600 relatively distant from the surface of the light-shielding composition 600 may remain uncured. That is, the first and second partially cured layers 110a and 160a may substantially overlap with the openings of the mask M1.

Figure 18F:
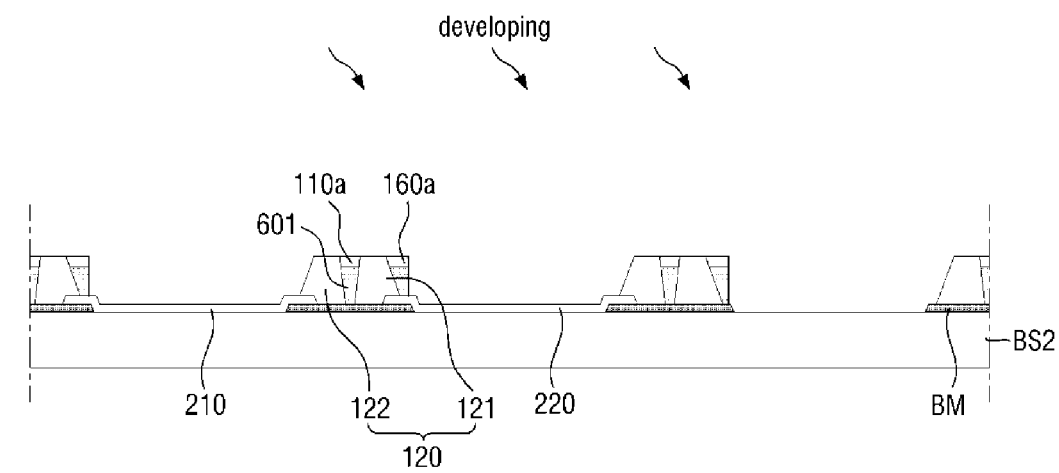

Thereafter, referring to FIG. 18F, a light-shielding composition 602 that remains uncured is removed from between adjacent portions of the light-transmitting structure 120. The removal of the light-shielding composition 602 may be a step of removing the light-shielding composition 602 by applying a developer. In this manner, the first partially cured layer 110a may be formed to fill the groove 120g of the light-transmitting structure 120, and the second partially cured layer 160a may be formed on the outer side of the first light-transmitting structure 120. Since only desired portions of the light-shielding composition 600 are exposed using a mask, a relatively large amount of the light-shielding composition 600 can remain uncured, and as a result, partially cured layers can be distinctly formed even when the duration of application of the developer is reduced.

Figure 18G:
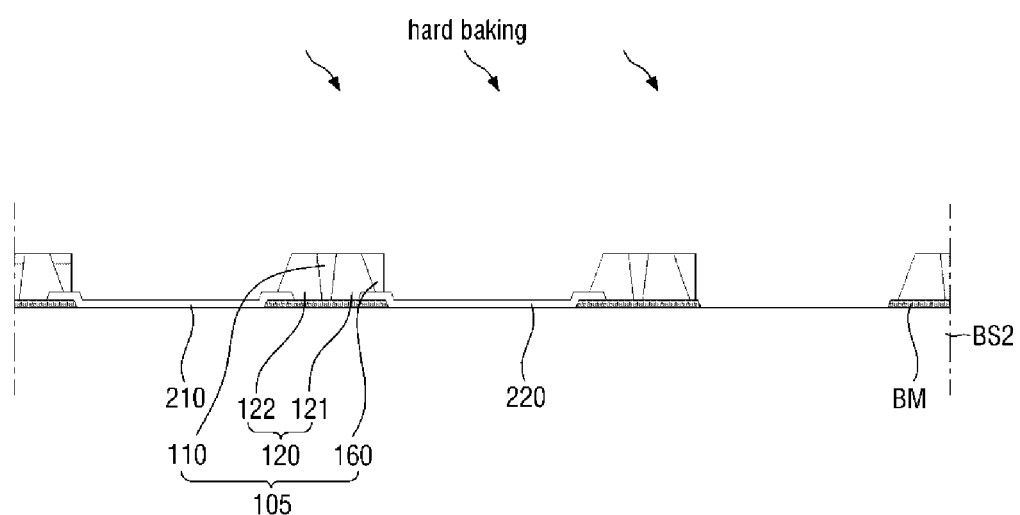

Thereafter, referring to FIG. 18G, first and fourth partition wall portions 110 and 160 are formed by hard-baking a light-shielding composition 601. Specifically, the first partially cured layer 110a disposed in the groove 120g of the light-transmitting structure 120 and the second partially cured layer 160a disposed on the outer side of the light-transmitting structure 120 may be completely cured by high-temperature thermal treatment performed during the hard-baking of the light-shielding composition 601. As a result, the first partition wall portion 110 may be formed in the groove 120g, and the fourth partition wall portions 160 may be formed on the outer side of the light-transmitting structure 120. Since the light-transmitting structure 120 and the first and fourth partition wall portions 110 and 160 can be formed using a single mask, the manufacturing cost of a display device can be reduced.

Although not specifically illustrated, the fabrication of a display device may be completed in the same manner as that described above with reference to FIGS. 16H through 16K.

While the present invention has been particularly illustrated and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A display device including a plurality of pixels defined therein, the display device comprising:
   a first substrate;
   a partition wall disposed on the first substrate to define openings corresponding to the plurality of pixels;
   color conversion patterns disposed in the openings;
   a wavelength band filter disposed between the color conversion patterns and the first substrate; and
   a light-shielding member disposed between the first substrate and the partition wall,
   wherein:
   the partition wall comprises a light-transmitting structure comprising a groove and a first partition wall portion disposed in the groove and having a higher optical density than the light-transmitting structure;
   a portion of the wavelength band filter is disposed between the light-transmitting structure and the first substrate;
   the portion of the wavelength band filter overlaps a portion of the light-transmitting structure;
   no portion of the wavelength band filter overlaps the first partition wall portion; and
   the first partition wall portion is in contact with the light-transmitting structure and the light-shielding member.

2. The display device of claim 1, wherein the first partition wall portion extends in a first direction and a second direction intersecting the first direction, and defines the openings corresponding to the plurality of pixels.

3. The display device of claim 2, wherein a minimum spacing distance, in the first direction, between adjacent portions of the partition wall is greater than a maximum width, in the first direction, of the groove.

4. The display device of claim 1, wherein:
   the partition wall comprises a plurality of first portions extending in a first direction and a plurality of second portions extending in a second direction intersecting the first direction;
   the openings are defined by the first portions and the second portions; and
   the color conversion patterns comprise a quantum dot material or a fluorescent material.

5. The display device of claim 1,
   wherein
   a maximum width of the partition wall is less than a maximum width of the light-shielding member.

6. The display device of claim 1, further comprising a light-shielding member disposed between the first substrate and the partition wall,
   wherein the first partition wall portion comprises substantially a same material as the light-shielding member.

7. The display device of claim 1, wherein:
   the light-transmitting structure has a light transmittance of about 90% or higher; and
   the first partition wall portion has an optical density of about 2.0/2 μm or higher.

8. The display device of claim 1, wherein:
   the first partition wall portion has a height equal to or greater than about 7.0 μm; and
   the first partition wall portion has a width equal to or greater than about 1.0 μm.

9. A display device including a plurality of pixels defined therein, the display device comprising:
   a first substrate;
   a partition wall disposed on the first substrate to define openings corresponding to the plurality of pixels;
   color conversion patterns disposed in the openings;
   a wavelength band filter disposed between the color conversion patterns and the first substrate,
   wherein:
   the partition wall comprises a light-transmitting structure comprising a groove and a first partition wall portion disposed in the groove and having a higher optical density than the light-transmitting structure;
   a portion of the wavelength band filter is disposed between the light-transmitting structure and the first substrate;
   the portion of the wavelength band filter overlaps a portion of the light-transmitting structure;
   no portion of the wavelength band filter overlaps the first partition wall portion; and
   the partition wall further comprises second partition wall portions disposed between the light-transmitting structure and the color conversion patterns and having a higher optical density than the light-transmitting structure.

10. The display device of claim 9, wherein:
    the second partition wall portions are in contact with the color conversion patterns; and a slope of sides of the second partition wall portions in contact with the color conversion patterns is different from a slope of sides of the second partition wall portions in contact with the light-transmitting structure.

11. A display device including a plurality of pixels defined therein, the display device comprising:
a first substrate;
a partition wall disposed on the first substrate to define openings corresponding to the plurality of pixels; and
color conversion patterns disposed in the openings,
wherein:
the partition wall comprises a light-transmitting structure comprising a groove and a first partition wall portion disposed in the groove and having a higher optical density than the light-transmitting structure;
the plurality of pixels comprise a first pixel displaying a first color and a second pixel displaying a second color having a shorter peak wavelength than the first color;
the display device further comprises: a first wavelength band filter disposed between the color conversion patterns and the first substrate and disposed in the first pixel; a liquid crystal layer disposed on the color conversion patterns; a second wavelength band filter disposed between the color conversion patterns and the liquid crystal layer; a polarizing layer disposed between the second wavelength conversion filter and the liquid crystal layer; a second substrate disposed on the liquid crystal layer; and a light source unit disposed on the second substrate and providing light of the second color;
the color conversion pattern comprises a first color conversion pattern disposed in the first pixel and configured to convert light incident thereupon into light of the first color and emit the converted light;
the first wavelength band filter is configured to transmit therethrough light of a wavelength band including a peak wavelength of the first color and block the transmission of light of a wavelength band including a peak wavelength of the second color;
the second wavelength band filter is configured to transmit therethrough light of a wavelength band including the peak wavelength of the second color and reflect light of a wavelength band including the peak wavelength of the first color; and
the second wavelength band filter is in contact with the first color conversion pattern, the light-transmitting structure, and the first partition wall portion.

12. The display device of claim 11, wherein:
the plurality of pixels further comprise a third pixel displaying a third color, which has a longer peak wavelength than the second color and has a different peak wavelength from the first color;
the display device further comprises a light-transmitting pattern disposed in the second pixel;
the color conversion patterns further comprise a second color conversion pattern disposed in the third pixel;
the second color conversion pattern is configured to convert light incident thereupon into light of the third color and emit the converted light;
a third partition wall portion is disposed between the first and second color conversion patterns; and
the third partition wall portion is also disposed between the first color conversion pattern and the light-transmitting pattern.

13. The display device of claim 11, wherein:
the plurality of pixels further comprise a fourth pixel configured to display the first color;
the color conversion patterns further comprise a third color conversion pattern disposed in the fourth pixel;
the third color conversion pattern is configured to convert light incident thereupon into light of the first color and emit the converted light; and
the first partition wall portion is disposed between the first and third color conversion patterns.

14. The display device of claim 11, wherein:
the plurality of pixels further comprise a third pixel configured to display a third color, which has a longer peak wavelength than the second color and has a different peak wavelength from the first color;
the display device further comprises a light-shielding member disposed between the first substrate and the partition wall
the first wavelength band filter is formed as one integral body over the first and third pixels; and
the first wavelength band filter is in contact with the light-transmitting structure, the first partition wall portion, and the light-shielding member.

* * * * *